(12) United States Patent
Hsieh et al.

(10) Patent No.: US 10,825,970 B2
(45) Date of Patent: Nov. 3, 2020

(54) LIGHT-EMITTING DEVICE WITH WAVELENGTH CONVERSION STRUCTURE

(71) Applicant: EPISTAR CORPORATION, Hsinchu (TW)

(72) Inventors: Min-Hsun Hsieh, Hsinchu (TW); Ming-Chi Hsu, Hsinchu (TW); Ching-Tai Cheng, Hsinchu (TW); Yu-Hsi Sung, Hsinchu (TW); Lung-Kuan Lai, Hsinchu (TW); Yih-Hua Renn, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 15/442,063

(22) Filed: Feb. 24, 2017

(65) Prior Publication Data

US 2017/0250327 A1  Aug. 31, 2017

(30) Foreign Application Priority Data

Feb. 26, 2016  (TW) .............. 105105767 A
Feb. 21, 2017  (TW) .............. 106105686 A

(51) Int. Cl.
*H01L 33/60* (2010.01)
*H01L 33/50* (2010.01)
*H01L 33/48* (2010.01)

(52) U.S. Cl.
CPC ............ *H01L 33/60* (2013.01); *H01L 33/486* (2013.01); *H01L 33/507* (2013.01)

(58) Field of Classification Search
CPC ....... H01L 33/60; H01L 33/54; H01L 33/505; H01L 33/385; H01L 33/483; H01L 33/58
(Continued)

(56) References Cited

U.S. PATENT DOCUMENTS 7,828,993 B2  11/2010 Roth et al.
8,556,672 B2  10/2013 Imazu
(Continued)

FOREIGN PATENT DOCUMENTS

CN  101701674 A  5/2010
CN  202339916 U  7/2012
(Continued)

*Primary Examiner* — Mohammad M Hoque
(74) *Attorney, Agent, or Firm* — Muncy, Geissler, Olds & Lowe, P.C.

(57) ABSTRACT

An embodiment of present disclosure discloses a light-emitting device which includes a light-emitting unit, a transparent covering structure, a first reflective structure, a second reflective structure, and a wavelength conversion structure. The light-emitting unit includes a light-emitting surface, a bottom surface opposite to the light-emitting surface, a side surface, a first conductive electrode, and a second conductive electrode. The first conductive electrode and the second conductive electrode are located on the bottom surface. The transparent covering structure covers the light-emitting surface and the side surface. The first reflective structure surrounds the transparent covering structure. The second reflective structure is disposed under the first reflective structure and surrounds the first conductive electrode and the second conductive electrode. The wavelength conversion structure is disposed on the first reflective structure and the transparent covering structure.

19 Claims, 24 Drawing Sheets

(58) Field of Classification Search
USPC .......................................................... 257/98
See application file for complete search history.

(56) References Cited

U.S. PATENT DOCUMENTS

| | | | | |
|---|---|---|---|---|
| 2011/0260184 | A1* | 10/2011 | Furuyama | H01L 33/38 |
| | | | | 257/98 |
| 2012/0120118 | A1* | 5/2012 | Chan | G02B 6/0023 |
| | | | | 345/690 |
| 2012/0267659 | A1 | 10/2012 | Chou et al. | |
| 2012/0302124 | A1* | 11/2012 | Imazu | H01L 33/486 |
| | | | | 445/58 |
| 2013/0092961 | A1* | 4/2013 | Kim | H01L 33/60 |
| | | | | 257/88 |
| 2014/0042481 | A1 | 2/2014 | Inoue et al. | |
| 2015/0008467 | A1* | 1/2015 | Sawada | H01L 33/486 |
| | | | | 257/98 |
| 2015/0050760 | A1 | 2/2015 | Imazu et al. | |
| 2016/0093780 | A1* | 3/2016 | Beppu | H01L 33/60 |
| | | | | 257/98 |
| 2016/0240746 | A1* | 8/2016 | Yun | H01L 33/502 |
| 2018/0013039 | A1* | 1/2018 | Hashimoto | H01L 33/486 |
| 2018/0175265 | A1* | 6/2018 | Kim | H01L 33/60 |
| 2018/0198046 | A1* | 7/2018 | Hwang | H01L 33/54 |
| 2018/0212128 | A1* | 7/2018 | Hayashi | H01L 33/508 |

FOREIGN PATENT DOCUMENTS

| | | | |
|---|---|---|---|
| CN | 104681698 A | | 6/2015 |
| CN | 105006508 A | | 10/2015 |
| CN | 105098027 A | | 11/2015 |
| JP | 2010192629 | * | 9/2010 |
| JP | 2014110333 A | | 6/2014 |
| JP | 5680472 B2 | | 3/2015 |

* cited by examiner

LIGHT-EMITTING DEVICE WITH WAVELENGTH CONVERSION STRUCTURE

TECHNICAL FIELD

The present disclosure relates to a light-emitting device and in particular to a light-emitting device having a reflective structure surrounding a transparent covering structure.

RELATED APPLICATION

This application claims priority to and the benefit of Taiwan Application Ser. No. 105105767 filed on Feb. 26, 2016 and Taiwan Application Ser. No. 106105686 filed on Feb. 21, 2017, which are incorporated herein by reference in their entireties.

DESCRIPTION OF THE RELATED ART

The light-emitting diodes (LEDs) of the solid-state lighting elements have the characteristics of low power consumption, long operating life, small volume, quick response so the LED replaces the conventional lighting fixtures gradually and is used in various applications of light-emitting devices.

In the different lighting applications of LED, the light of different color is emitted from the LED with the phosphor. However, the luminous efficiency of the combination of the LED and the phosphor is not good as expected. Therefore, it is important to increase the luminous efficiency of the phosphor which is used in the light emitting device.

SUMMARY OF THE DISCLOSURE

A light-emitting device which includes a light-emitting unit, a transparent covering structure, a first reflective structure, a second reflective structure, and a wavelength conversion structure. The light-emitting unit includes a light-emitting surface, a bottom surface opposite to the light-emitting surface, a side surface, a first conductive electrode and a second conductive electrode. The first conductive electrode and the second conductive electrode are located on the bottom surface. The transparent covering structure covers the light-emitting surface and the side surface. The first reflective structure surrounds the transparent covering structure. The second reflective structure is disposed under the first reflective structure and surrounds the first conductive electrode and the second conductive electrode. The wavelength conversion structure is disposed on the first reflective structure and the transparent covering structure.

The following description illustrates embodiments and together with drawings to provide a further understanding of the disclosure described above.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1A:
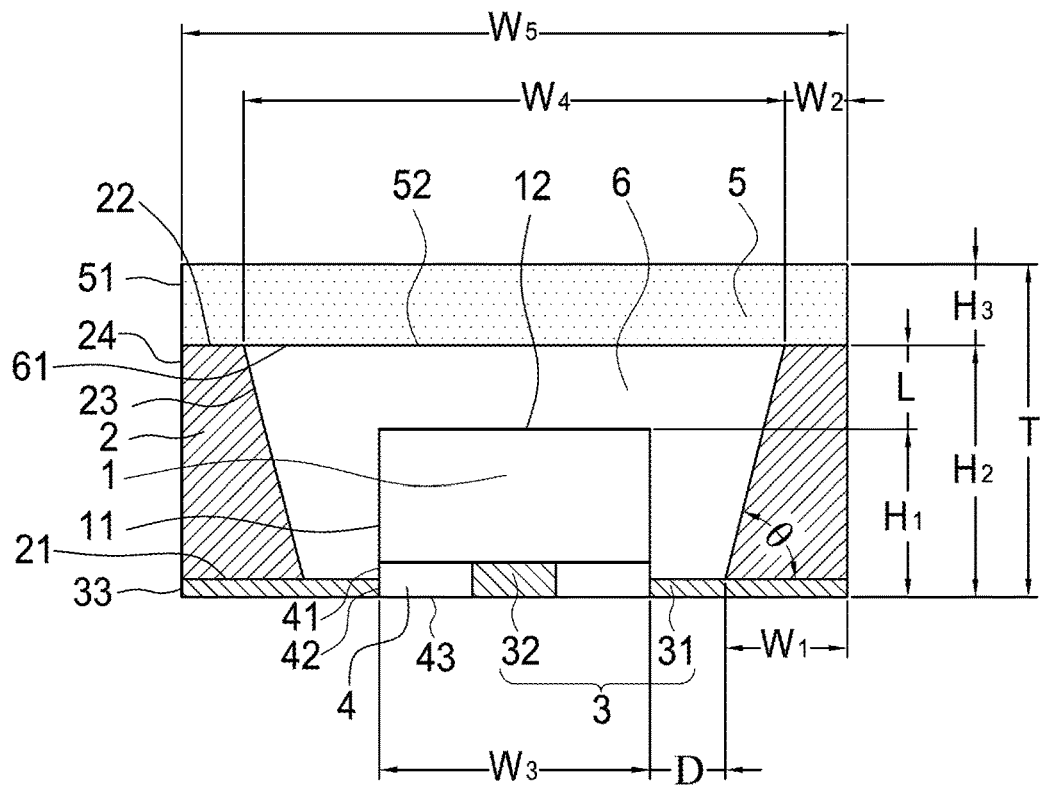
FIG. 1A shows a cross-sectional view of a light-emitting device in accordance with an embodiment of the present disclosure.
Figure 1B:
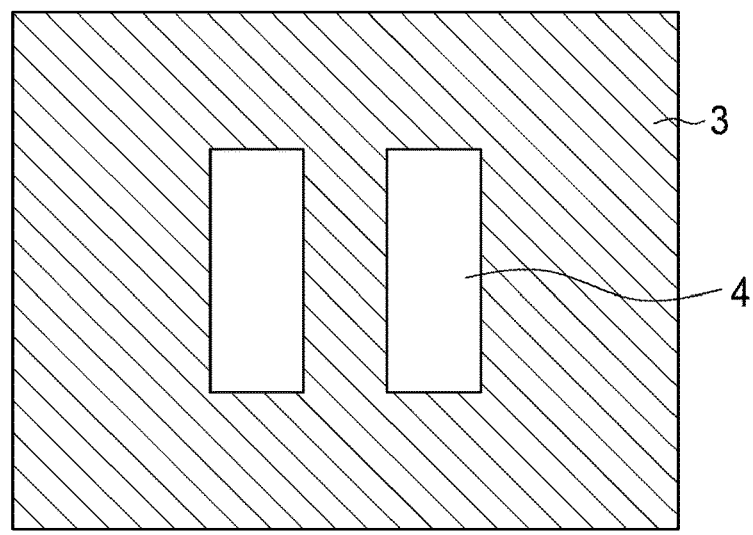
FIG. 1B shows a bottom view of a light-emitting device shown in FIG. 1A.

FIG. 1A shows a cross-sectional view of a light-emitting device 100 in accordance with an embodiment of the present disclosure. FIG. 1B shows a bottom view of a light-emitting device 100. The light-emitting device 100 includes a light-emitting unit 1, a first reflective structure 2, a second reflective structure 3, a transparent covering structure 6, and a wavelength conversion structure 5. The light-emitting unit 1 includes a light-emitting surface 12, two conductive electrodes 4 disposed on a bottom surface opposite to the light-emitting surface 12 of the light-emitting unit 1, and a plurality of side surfaces 11. To be more specific, each of the conductive electrodes 4 includes an upper portion 41 which is closer to the light-emitting surface 12, and a lower portion 42 which is further to the light-emitting surface 12. Besides, the outmost edge of each of the conductive electrodes 4 does not exceed the outmost edge of the light-emitting unit 1 (that is, the conductive electrode 4 may be coplanar with or shrunk from the outermost edge of the light-emitting unit 1). The first reflective structure 2 surrounds the side surfaces 11 of the light-emitting unit 1 and the upper portion 41 of the conductive electrode 4. The first reflective structure 2 includes a bottom surface 21, a top surface 22, an inner surface 23, and an outer surface 24. The inner surface 23 and the outer surface 24 can have the same reflection coefficient or different reflection coefficients when there are different manufacturing flows or materials. The bottom surface 21 has a width W1, the top surface 22 has a width W2, and W1>W2. The inner surface 23 is an inclined surface which is not parallel to the side surface 11 of the light-emitting unit 1 and has an angle θ with the bottom surface 21, θ is acute and has a range between 0~90 degree. The outer surface 24 is substantially vertical to the bottom surface 21. That is to say, the first reflective structure 2 has a trapezoidal shape that has the upper portion which is narrower and the lower portion which is wider in the cross-sectional view. The top surface 22 of the first reflective structure 2 is not coplanar to the light-emitting surface 12 of the light-emitting unit 1 and disposed right above the light-emitting surface 12 in the cross-sectional view. The top surface 22 of the first reflective structure 2 has a height difference L to the light-emitting surface 12, and L is larger than zero. The second reflective structure 3 is located under the first reflective structure 2 and includes a first portion 31 surrounding the lower portion 42 of the conductive electrode 4 and a second portion 32 covering an area between two conductive electrodes 4. Further, a first end of the first portion 31, which is close to the light-emitting unit 1, covers an outer surface of the lower portion 42 of the conductive electrode 4, and a second end is located under the first reflective structure 2 and directly contacts the bottom surface 21. The second portion 32 is filled in an area between two conductive electrodes 4 and has two ends directly contacting the side surfaces of the conductive electrodes 4. Therefore, the bottom surface of the light-emitting unit 1 has a portion not covered by the conductive electrodes 4 being fully or partially covered by the second reflective structure 3. Referring to the bottom view of the light-emitting device 100 shown in FIG. 1B, the second reflective structure 3 surrounds two conductive electrodes 4. In another embodiment, the first reflective structure 2 and the second reflective structure 3 are formed by one manufacturing process. The bottom surface of the second reflective structure 3 is coplanar with the bottom surfaces 43 of two conductive electrodes 4. In another embodiment, the first portion 31 and/or the second portion 32 of the second reflective structure 3 has a curved bottom surface (for example, in the cross-sectional view), and the bottom surface of the second reflective structure 3 is not coplanar to the bottom surfaces 43 of two conductive electrodes 4.

In an embodiment, the transparent covering structure 6 of the light-emitting device 100 can include or not include the wavelength converting materials (for example, the phosphor, fluorescent dyes, nano particles, and so on). The transparent covering structure 6 is located among the first reflective structure 2, the second reflective structure 3, and the light-emitting unit 1. The transparent covering structure 6 surrounds the side surfaces 11 of the light-emitting unit 1 and the upper portion 41 of the conductive electrode 4 and fully covers the light-emitting surface 12 of the light-emitting unit 1. The wavelength conversion structure 5 is located on the transparent covering structure 6 and covers first reflective structure 2, the transparent covering structure 6, and the light-emitting unit 1. The bottom surface 52 of the wavelength conversion structure 5 is substantially coplanar with and directly contacts to the top surface 61 of the transparent covering structure 6 and the top surface 22 of the first reflective structure 2. In other words, the transparent covering structure 6 is located among the first reflective structure 2, the second reflective structure 3, and the wavelength conversion structure 5, and surrounds the light-emitting unit 1. The side surface 51 of the wavelength conversion structure 5, the outer surface 24 of the first reflective structure 2, and the outer surface 33 of the second reflective structure 3 are substantially coplanar (coplanar in at least one cross-sectional view as shown in FIG. 1A). In another embodiment, the outer surface 33 of the second reflective structure 3 is not coplanar to the outer surface 24 of the first reflective structure 2 and is located under the bottom surface 21 of the first reflective structure 2. Despite that, the periphery of the transparent covering structure 6 is fully surrounded by the wavelength conversion structure 5, the first reflective structure 2, and the second reflective structure 3 and does not in contact with the ambience. Accordingly, the first reflective structure 2 and the second reflective structure 3 are formed as a structure like a reflective cup which can reflect the light emitted from the light-emitting unit 1 toward the top surface 61 of the transparent covering structure 6. Then, the light is converted by the wavelength conversion structure 5 and/or mixed to a specific light to make the light-emitting device 100 emit the light upwardly. When the transparent covering structure 6 includes the wavelength converting materials which can convert the light emitted from the light-emitting unit 1, the wavelength converting materials in the transparent covering structure 6 are the same as that in the wavelength conversion structure 5. When the materials are the same, the concentration of the wavelength converting materials in the wavelength conversion structure 5 can differ from that in transparent covering structure 6. For example, the concentration of the wavelength converting materials in the wavelength conversion structure 5 is larger than that in the transparent covering structure 6. The wavelength converting materials in the transparent covering structure 6 can also be different from that in the wavelength conversion structure 5. For example, the wavelength conversion structure 5 includes the phosphor with a shorter emission wavelength (for example, yellow/yellow-greenish phosphor) or the phosphor with a longer emission wavelength (for example, red phosphor). In an embodiment, a portion of the transparent covering structure 6 is located between two conductive electrodes 4, for example, a portion of the transparent covering structure 6 is between the second portion 32 of the second reflective structure 3 and the light-emitting unit 1.

Referring to FIG. 1A, in an embodiment, the light-emitting device 100 has a total height T, which is not more than 650 μm. In another embodiment, T is not more than 570 μm. The light-emitting unit 1 has a height H1, which is the distance between the bottom surface 43 of the conductive electrode 4 and the light-emitting surface 12. The first reflective structure 2 and the second reflective structure 3 collectively have a height H2. The wavelength conversion structure 5 has a height H3. The bottom surface 52 of the wavelength conversion structure 5 has a distance L, which is larger than zero, to the light-emitting surface 12 of the light-emitting unit 1. In the embodiment, 0<L≤200 μm. Besides, H2>H1 and H2/H1 is of about 1.2~2.5. In an embodiment, H2/H1=1.2, 1.55, or 2. T/H3 is of about 1.2~4.7. In an embodiment, T/H3=1.6~4.5, 1.7, 2.1, or 4.3. The light-emitting surface 12 of the light-emitting unit 1 has a width W3, the top surface 61 of the transparent covering structure 6 has a width W4, the wavelength conversion structure 5 has a width W5, and W5>W4>W3. In other words, the wavelength conversion structure 5 fully covers the transparent covering structure 6 and the light-emitting unit 1, and the transparent covering structure 6 fully covers the light-emitting unit 1 in the top view. Otherwise, W5/W3 is of about 1.2~3. In an embodiment, W5/W3=1.3~2.6, 1.4, 2, 2.1, or 2.4. W5/W4 is of about 1~1.4. In an embodiment, W5/W4=1.25, 1.27, or 1.31. The inner surface 23 of the first reflective structure 2 has a distance D, which is larger than zero, to the side surface 11 of the light-emitting unit 1. In the embodiment, 50 μm≤D≤300 μm. W3/D is of about 2~11. In an embodiment, W3/D=2.24, 3.13, 3.4, 6.6, 7.62, 7.8, 9, 10.2, 13.2 or so on. When the dimension is in the aforementioned range, the light-emitting device 100 generally has a good optic characteristic, such as the luminous efficiency, the lighting field, and the color temperature.

In an embodiment, the light-emitting unit 1 is a semiconductor light-emitting device which can emit the non-coherent light. The light-emitting unit 1 includes a substrate, a first-type semiconductor layer, an active stack, and a second-type semiconductor layer. The first-type semiconductor layer and the second-type semiconductor layer, for example a cladding layer or a confinement layer, provide holes and electrons, respectively, and the electrons and holes are combined in the active stack to emit light. The first-type semiconductor layer, the active layer, and the second-type semiconductor layer include a semiconductor material of III-V group, such as $Al_xIn_yGa_{(1-x-y)}N$ or $Al_xIn_yGa_{(1-x-y)}P$ with 0≤x, y≤1, (x+y)≤1. Based on the material of the active stack, the light-emitting unit 1 can emit a red light having a peak wavelength or dominant wavelength between 610~650 nm, a green light having a peak wavelength or dominant wavelength between 530~570 nm, a blue light having a peak wavelength or dominant wavelength between 450~490 nm, a near ultra-violet light having a peak wavelength or dominant wavelength between 405~450 nm, or a ultra-violet light having a peak wavelength or dominant wavelength between 280~400 nm. The substrate can be a growth substrate for epitaxially growing the first-type semiconductor layer, the active stack, and the second-type semiconductor layer in sequence thereon; or be a carrier for the first-type semiconductor layer, the active stack, and the second-type semiconductor layer in sequence located thereon after removing the growth substrate. The substrate can be made of a material, such as, Ge, GaAs, InP, sapphire, SiC, Si, $LiAlO_2$, ZnO, GaN, AlN, metal, glass, composite, diamond, CVD diamond, Diamond-Like Carbon (DLC) or so on.

In an embodiment, the conductive electrode 4 can be a metal, such as Au, Ag, Cu, Cr, Al, Pt, Ni, Ti, Sn, alloy thereof, or multilayer structure thereof. The transparent covering structure 6 includes silicone, epoxy, PI, BCB, PFCB, SU8, acrylic resin, PMMA, PET, PC, polyetherimide, fluorocarbon polymer, $Al_2O_3$, SINR, or SOG.

In an embodiment, the wavelength conversion structure 5 includes a matrix and a wavelength converting materials, and the wavelength converting materials in the wavelength conversion structure 5 is the same as or different from that in the transparent covering structure 6. The wavelength converting materials includes a plurality of wavelength conversion particles dispersed in the matrix. Selectively, the wavelength conversion structure 5 can further include the diffusing particles. The matrix can include epoxy, silicone, PI, BCB, PFCB, SU8, acrylic resin, PMMA, PET, PC, or polyetherimide. The wavelength conversion particles include the yellow-greenish phosphor and red phosphor. The yellow-greenish phosphor includes aluminum oxide (for example, YAG, TAG), silicate, vanadate, alkaline-earth metal selenide, or metal nitride. The red phosphor includes silicate, vanadate, alkaline-earth metal sulfide, fluoride ($K_2TiF_6$:$Mn^{4+}$, $K_2SiF_6$:$Mn^{4+}$), oxynitride, or a mixture of tungstate and molybdate. The diffusing particles include titanium dioxide, zirconium oxide, zinc oxide, or aluminum oxide.

In an embodiment, the materials of the first reflective structure 2 and the second reflective structure 3 include a mixture of a matrix and a plurality of reflective particles. The matrix includes silicone-based material or epoxy-based material; the reflective particles include titanium dioxide, silicon dioxide, or aluminum oxide.

Figure 1C:
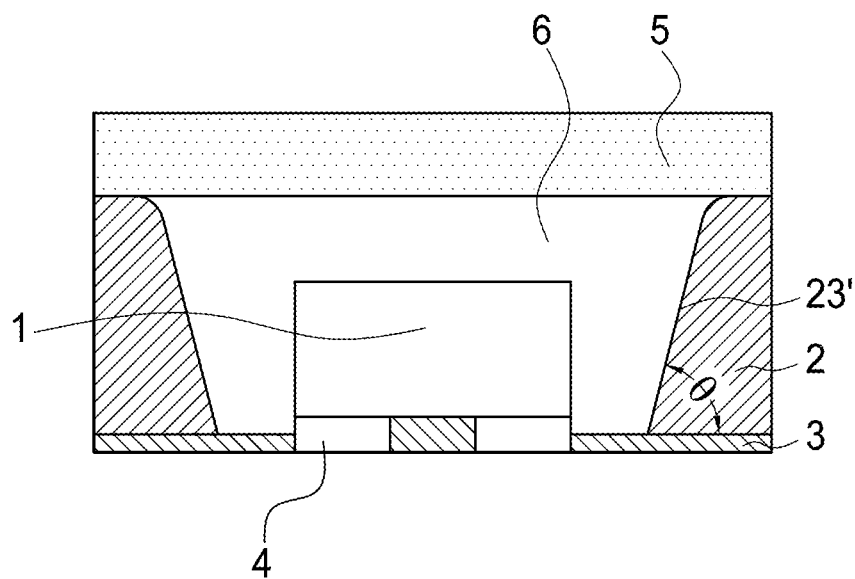
FIG. 1C shows a cross-sectional view of a light-emitting device in accordance with another embodiment of the present disclosure.

FIG. 1C shows a cross-sectional view of a light-emitting device 100 in accordance with another embodiment of the present disclosure. The related description of technic characteristics of the light-emitting device 100' can refer to aforementioned description of the light-emitting device 100. Besides, the inner surface 23' of the first reflective structure 2 which is close to the wavelength conversion structure 5 has a curved surface. The devices or elements with similar or the same symbols represent those with the same or similar functions to aforesaid embodiment can refer to aforementioned description.

Figure 2A:
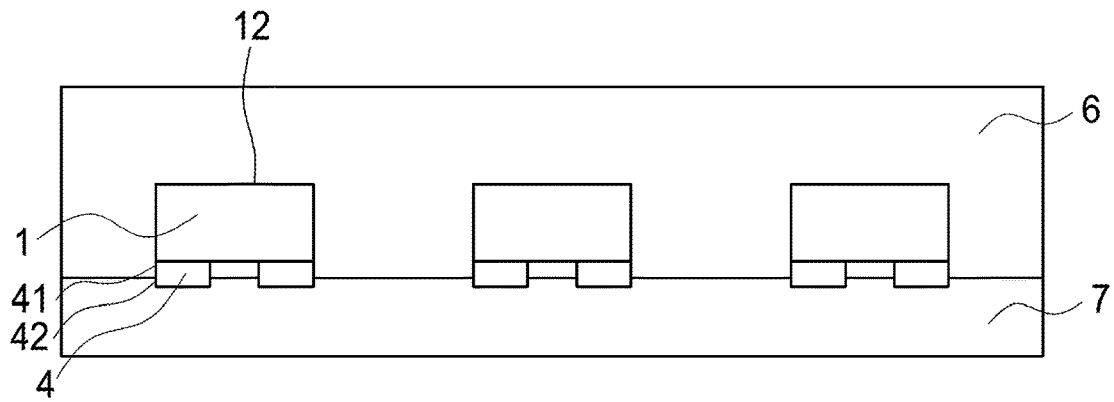
FIGS. 2A~2G show drawings of manufacturing a light-emitting device in accordance with an embodiment of the present disclosure.
Figure 2B:
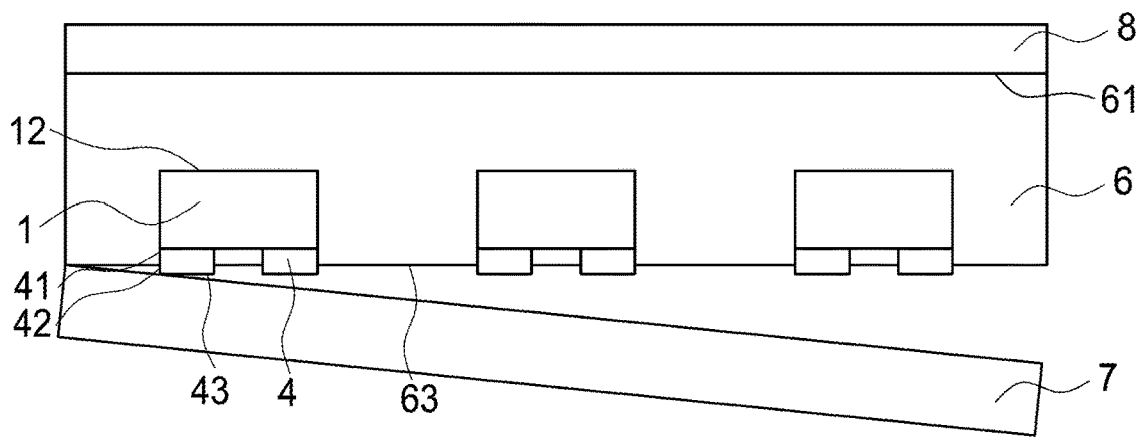

FIGS. 2A~2G show a manufacturing flow of a light-emitting device in accordance with an embodiment of the present disclosure. As shown in FIG. 2A, a first temporary carrier 7 which is adhesive is provided. Two conductive electrodes 4 of each of plurality of light-emitting units 1 are disposed on the first temporary carrier 7. The lower portion 42 of the conductive electrode 4 is embedded in the first temporary carrier 7. An area which is between the adjacent light-emitting units 1 is defined as an aisle. The precision of placing the light-emitting unit 1 on the first temporary carrier 7 is governed by the pick & place system, and generally the tolerance is not greater than ±15 μm. Then the transparent covering structure 6 is formed to fill in the aisle between the adjacent light-emitting units 1 and cover the light-emitting surface 12 of the light-emitting unit 1 and the top surface of the first temporary carrier 7 which is not covered by the light-emitting unit 1. The transparent covering structure 6 is formed by means of steel plate printing, coating, brushing, spin coating, ink jet printing, dispensing, molding, or the like. The material of the first temporary carrier 7 comprises thermal dissociation tape. As shown in FIG. 2B, a second temporary carrier 8 which is adhesive is adhered to the top surface 61 of the transparent covering structure 6. Thereafter, the first temporary carrier 7 is removed to expose the lower portion 42 and the bottom surface 43 of the conductive electrode 4, and the bottom surface 63 of the transparent covering structure 6. The removing method may be a laser lift off, heating separation, dissolution, or the like. It is noted that the bottom surface 63 of the transparent covering structure 6 is not coplanar with the bottom surface 43 of the conductive electrode 4. To be more specific, the lower portion 42 of the conductive electrode 4 is protruded from the transparent covering structure 6. The material of the second temporary carrier 8 may be a thermal release tape, a UV tape, a chemical release tape, a heat resistant tape, or a blue film.

Figure 2C:
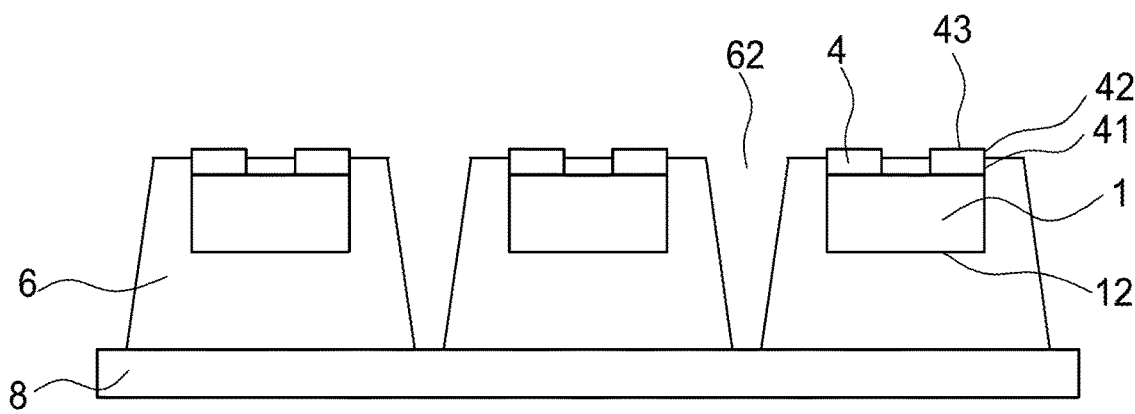
Figure 2D:
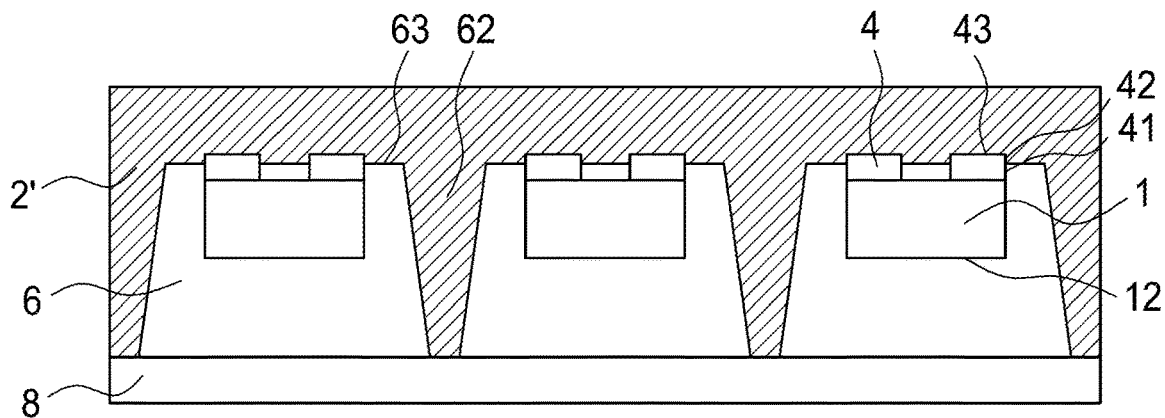
Figure 2E:
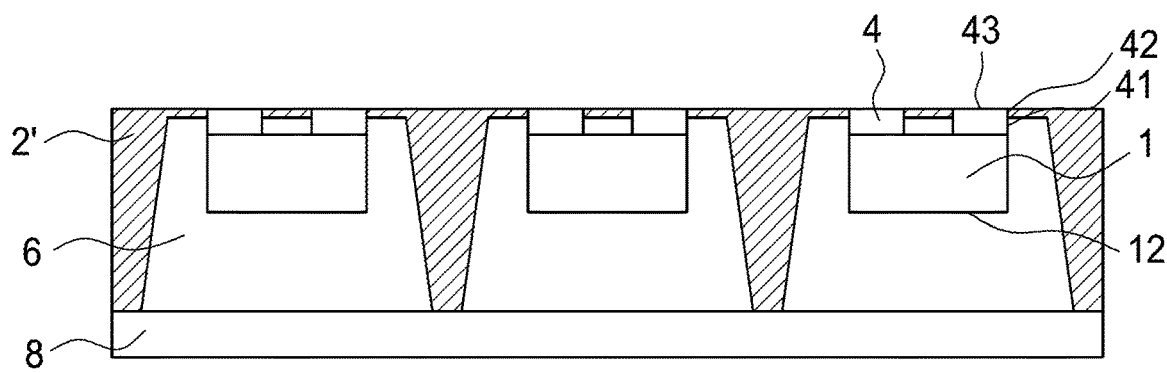

As shown in FIG. 2C, the structure in FIG. 2B is reversed. The transparent covering structure 6 is diced by a blade with wide upper portion and narrow lower portion to form a cutting track 62. The width of the cutting track 62 away from the second temporary carrier 8 is larger than that close to the second temporary carrier 8. In other words, the cutting track 62 makes the transparent covering structure 6 has a trapezoidal shape that has the upper portion which is narrower and the lower portion which is wider in the cross-sectional view. The narrower base (side) of the transparent covering structure 6 directly contacts the side surface of the conductive electrode 4 of the light-emitting unit 1. To be more specific, the blade may create cuts on the second temporary carrier 8, but not substantially separate the second temporary carrier 8 in the cutting track 62. In other words, each light-emitting unit 1 which is covered by the transparent covering structure 6 is adhered to the second temporary carrier 8. Next, as shown in FIG. 2D, a reflective structure 2' is formed in the cutting track 62 and covers the conductive electrode 4 of the light-emitting main unit 1, the bottom surface 63 of the transparent covering structure 6, and a space between the two conductive electrodes 4. The reflective structure 2' is formed by means of steel plate printing, coating, brushing, spin coating, ink jet printing, dispensing, sputtering, or molding. Subsequently, as shown in FIG. 2E, a polish process is performed to expose the bottom surface 43 of the conductive electrode 4 and make the reflective structure 2' substantially coplanar with the bottom surface 43 of the conductive electrode 4. In one embodiment, the reflective structure 2' comprises the first reflective structure 2 and the second reflective structure 3 shown in FIG. 1A.

Figure 2F:
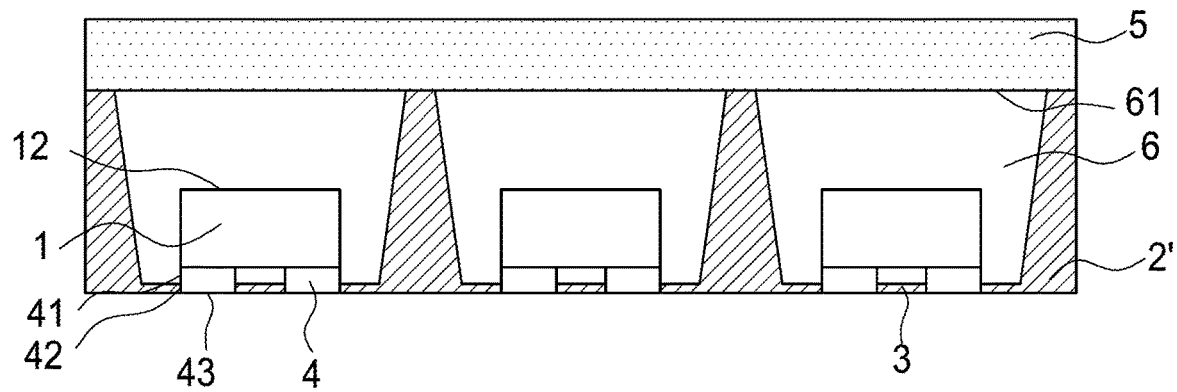
Figure 2G:
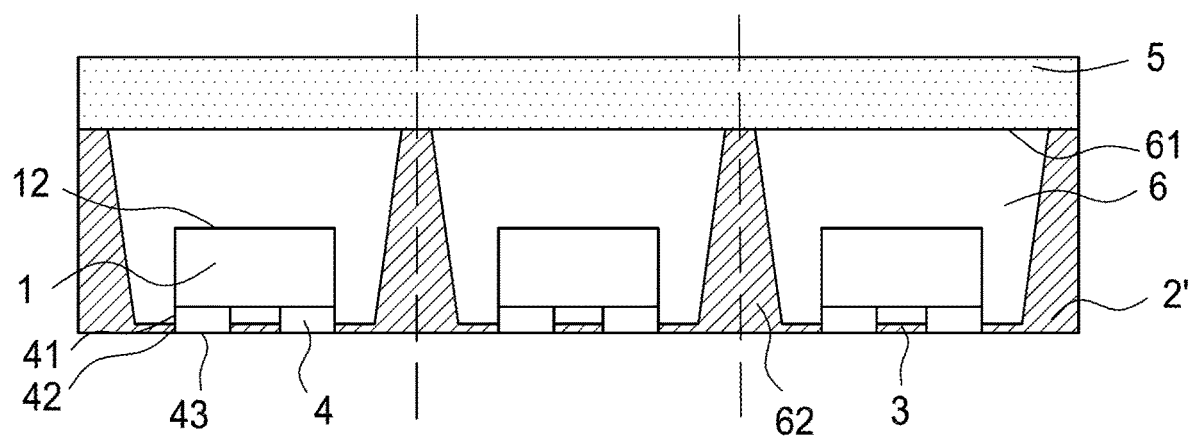

Next, as shown in FIG. 2F, the structure shown in FIG. 2E is reversed and the second temporary carrier 8 is removed by laser lift off, heating separation, dissolution, irradiating with ultraviolet light or the like. Here, a planarization process, such as a polish process, may be optionally performed to flatten the top surface 61 of the transparent covering structure 6. In addition, the planarization process can also remove the residues of the second temporary carrier 8 which remains on the transparent covering structure 6. Thereafter, the wavelength conversion structure 5 is formed on the top surface 61 of the transparent covering structure 6 by means of steel plate printing, coating, brushing, spin coating, ink jet printing, dispensing, pressing or molding. In this case, a polish process is optionally performed to flatten the top surface of the wavelength conversion structure 5. Finally, as shown in FIG. 2G, dicing is performed in the cutting tracks 62 to separate the light-emitting devices. In the step disclosed in FIG. 2G, the structure of FIG. 2F can be selectively reversed first (that is, the wavelength conversion structure 5 faces downward) before dicing. In another embodiment, a third temporary carrier (not shown) is firstly adhered to the other side of the wavelength conversion structure 5 which is opposite to the second temporary carrier 8 before removing the second temporary carrier 8. In the next step, the third temporary carrier is removed after the dicing process. The method of removing the third temporary carrier is the same as the removing method of the second temporary carrier 8 and is not repeated here.

In the step disclosed in FIG. 2A, the transparent covering structure 6 is filled between the two conductive electrodes 4 of the light-emitting unit 1. Therefore, as shown in FIG. 2G, a transparent covering structure 6 is located among the upper portions 41 of the two conductive electrodes 4 and contacts the reflective structure 2' which is between two conductive electrodes 4 of the light-emitting unit 1. Hence, the transparent covering structure 6 is located between the two conductive electrodes 4 of the light-emitting unit 1. In another embodiment, the transparent covering structure 6 is not formed between the two conductive electrodes 4 of the light-emitting unit 1. Therefore, there is no transparent covering structure 6 below the light-emitting unit 1, and the light-emitting device 100 as shown in FIG. 1A is formed.

Figure 3A:
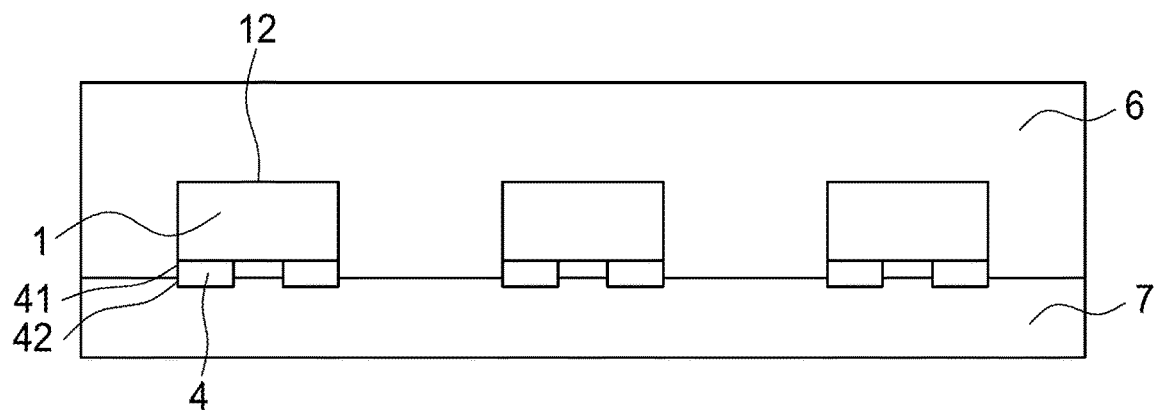
FIGS. 3A~3I show drawings of manufacturing a light-emitting device in accordance with another embodiment of the present disclosure.
Figure 3B:
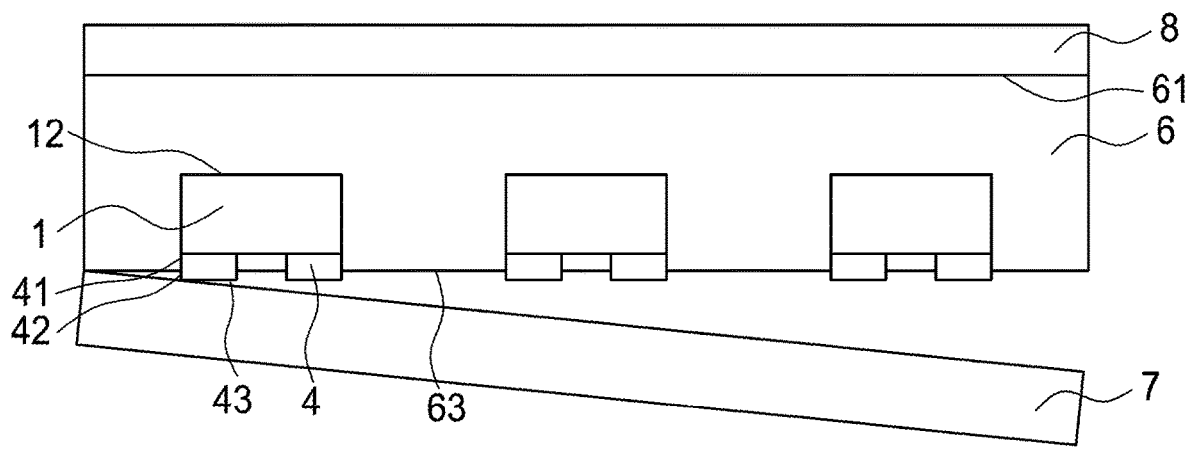
Figure 3C:
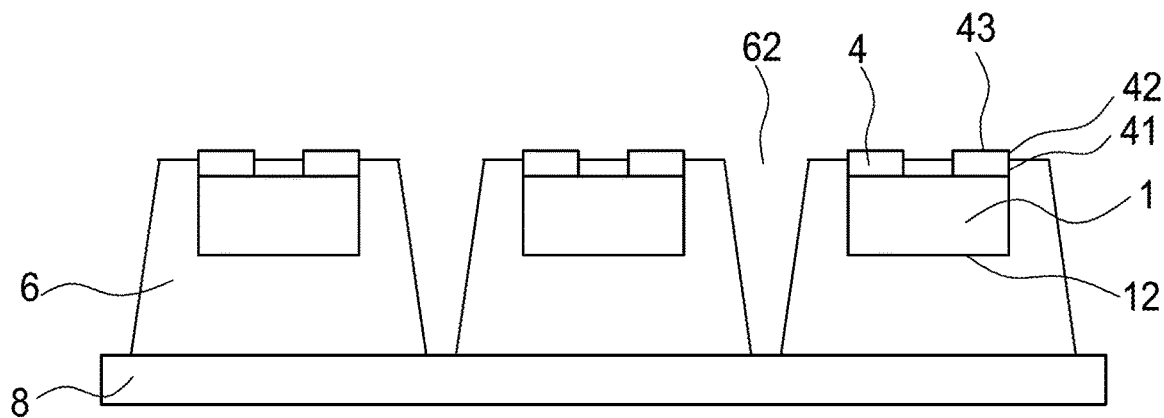
Figure 3D:
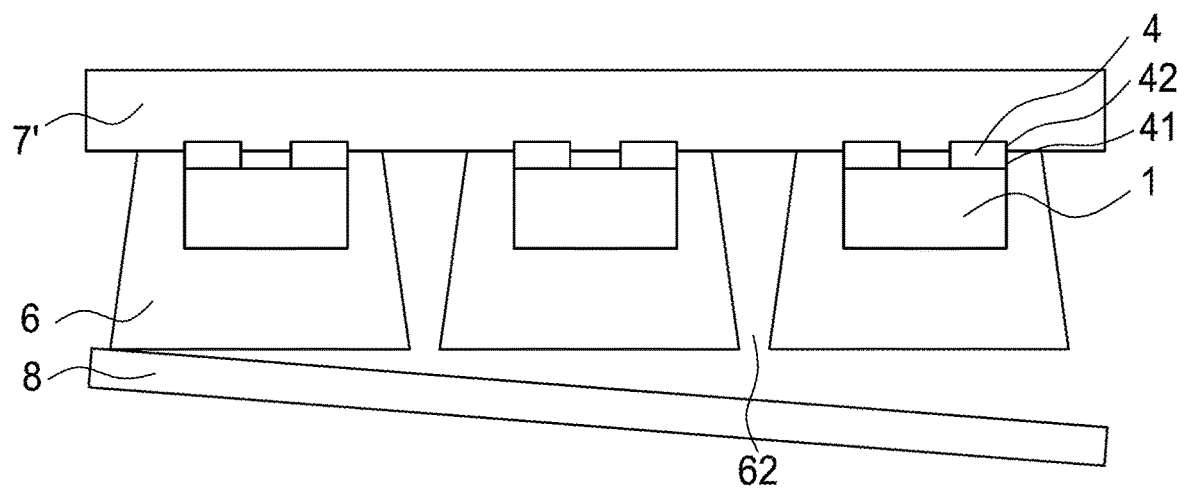
Figure 3E:
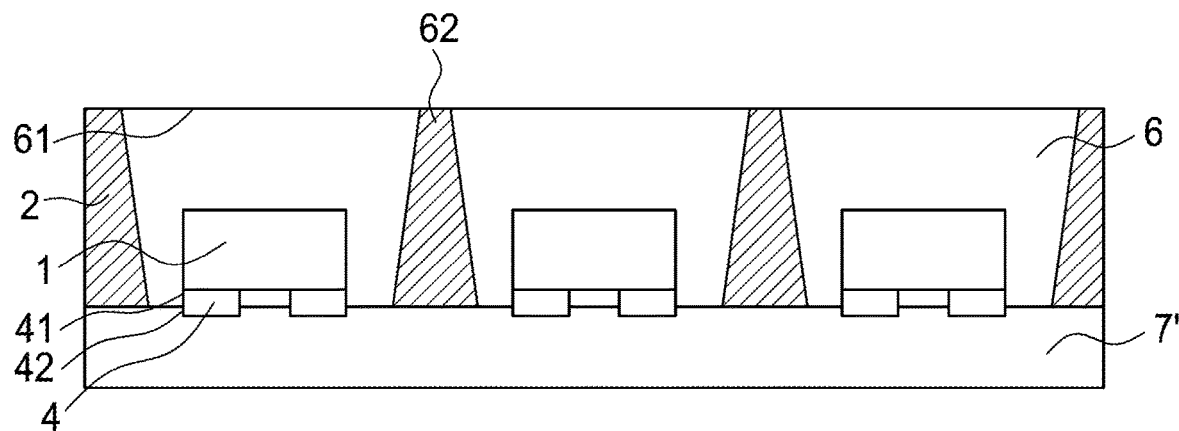
Figure 3F:
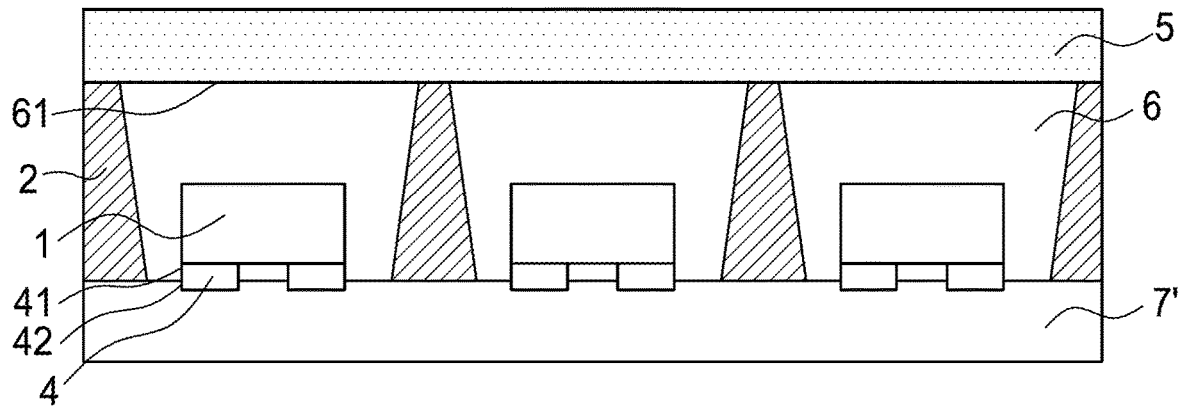
Figure 3G:
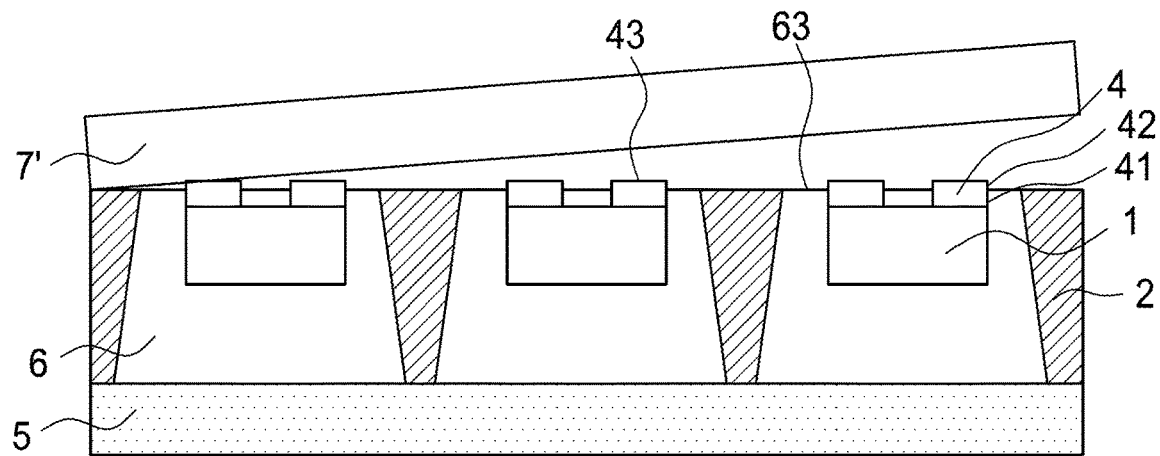
Figure 3H:
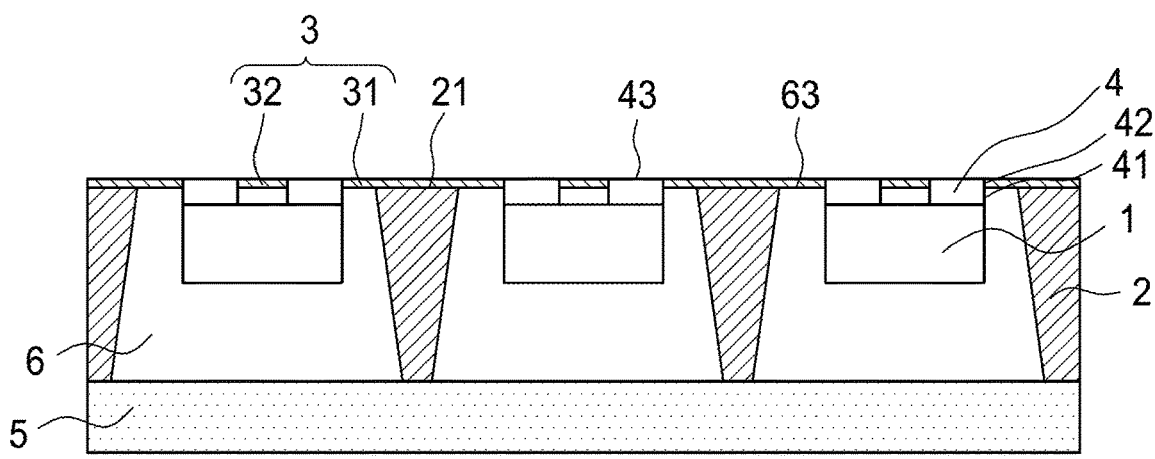
Figure 3I:
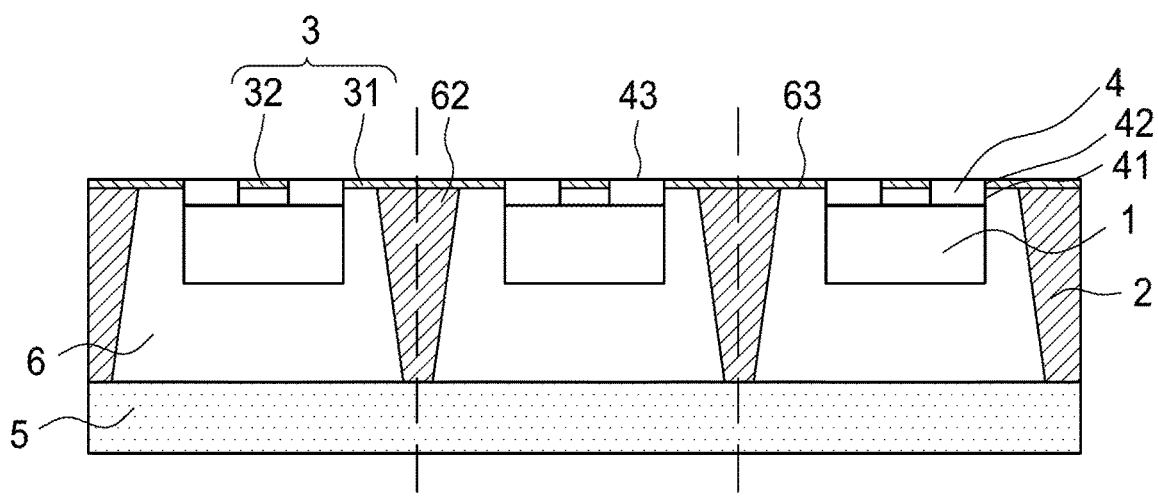

FIGS. 3A~3I show another manufacturing flow of a light-emitting device in according with an embodiment of the present disclosure. The same reference numerals, symbols are same as those in the above-described production flow are described in the foregoing description present similar or the same elements or devices, and the description thereof will be omitted. The steps of FIGS. 3A~3C are the same as those of FIGS. 2A~2C. Next, as shown in FIG. 3D, a fourth temporary carrier 7' is adhered to a side of the light-emitting unit 1 which is opposite to the second temporary carrier 8, and then the second temporary carrier 8 is removed. The fourth temporary carrier 7' has similar material characteristics as the first temporary carrier 7, and the lower portions 42 of the conductive electrodes 4 are embedded in the fourth temporary carrier 7'. Subsequently, as shown in FIG. 3E, the structure of FIG. 3D is reversed and the first reflective structure 2 is formed in the cutting track 62 by means of steel plate printing, coating, brushing, spin coating, ink jet printing, dispensing, sputtering, molding or the like. Here, a polish process may also be performed to flatten the top surface 61 of the transparent covering structure 6. In addition, the polish process can also clean the first reflective structure 2 that overflows to the transparent covering structure 6. Next, as shown in FIG. 3F, the wavelength conversion structure 5 is formed on the top surface 61 of the transparent covering structure 6 and the first reflective structure 2. As shown in FIG. 3G, the structure shown in FIG. 3F is reversed and the fourth temporary carrier 7' is removed. The lower portion 42 and the bottom surface 43 of the conductive electrode 4, and the bottom surface 63 of the transparent covering structure 6 are exposed. Next, as shown in FIG. 3H, the second reflective structure 3 is formed on the other side of the transparent covering structure 6 which is opposite to the wavelength conversion structure 5 by means of steel plate printing, coating, brushing, spin coating, inkjet printing or the like to surround the outer surface of the conductive electrode 4 and cover the bottom surface 63 of the transparent covering structure 6 and the bottom surface 21 of the first reflective structure 2. The second reflective structure 3 does not cover a portion of the bottom surface 43 of the conductive electrode 4 or does not cover the entire of the bottom surface 43. As shown in FIG. 3I, a dicing process is performed in the cutting tracks 62 to separate the plurality of light-emitting devices. In the step disclosed in FIG. 3H, another temporary carrier (not shown) is optionally adhered to the wavelength conversion structure 5 first, and then the second reflective structure 3 is formed. In the step shown in FIG. 3I, another temporary carrier (not shown) is removed after the dicing process is completed and the removing method is the same as the way of removing the second temporary carrier 8.

In the step disclosed in FIG. 3A, the transparent covering structure 6 is filled in a space located between the adjacent conductive electrodes 4 of the light-emitting unit 1. Therefore, as shown in FIG. 3H, the transparent covering structure 6 is located between the upper portions 41 of the adjacent conductive electrodes 4, so that the transparent covering structure 6 is located between the second portion 32 of the second reflective structure 3 which is located between the conductive electrodes 4 and the light-emitting unit 1. In another embodiment, the transparent covering structure 6 is not filled between the adjacent conductive electrodes 4 of the light-emitting unit 1. Hence, only the second portion 32 of the second reflective structure 3 is between the adjacent conductive electrodes 4 without the transparent covering structure 6 filled in. Then, the light-emitting device 100 is formed as shown in FIG. 1.

When the tip of the blade has an arc-shaped shape in a cross-sectional view, the transparent covering structure 6 has an arc-shaped shape near the second temporary carrier 8. Next, when the first reflective structure 2 is formed, the inner surface 23' has an arc-shaped surface or an arc-shaped line near the wavelength conversion structure 5 as the light-emitting device 100' shown in FIG. 1C.

Figure 4:
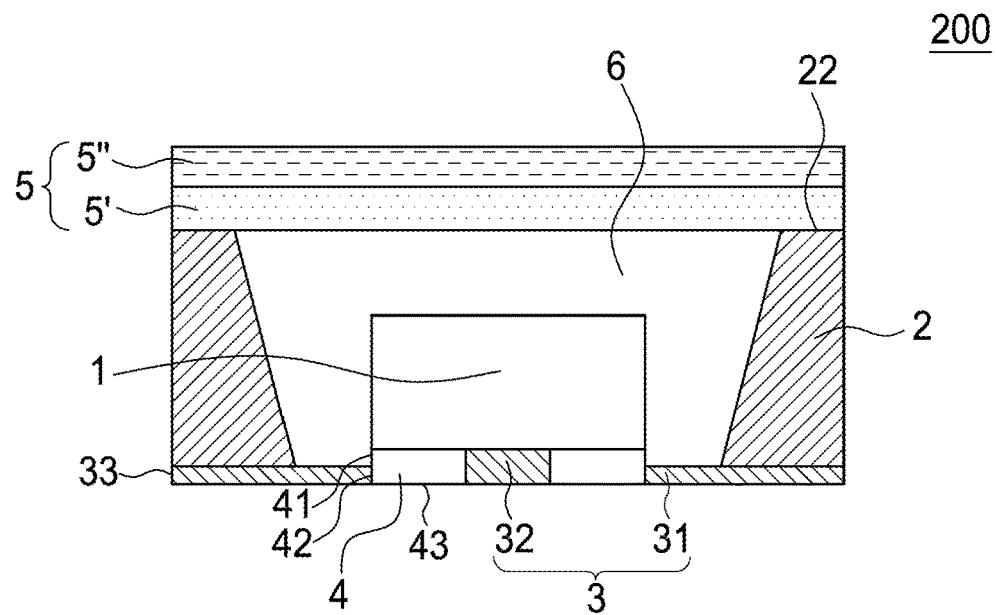
FIG. 4 shows a cross-sectional view of a light-emitting device in accordance with another embodiment of the present disclosure.

In another embodiment of the present disclosure, the wavelength conversion structure 5 of the light-emitting device 100 has a multilayer structure as shown in FIG. 4. The light-emitting device 200 is similar to the light-emitting device 100, the wavelength conversion structure 5 comprises a first wavelength conversion layer 5' and a second wavelength conversion layer 5". The first wavelength conversion layer 5' comprises a phosphor material different from that in the second wavelength conversion layer 5". For example, first wavelength conversion layer 5' comprises a composition of a yellow-green phosphor, the second wavelength conversion layer 5" comprises a composition of a red phosphor or a mixture of a yellow-green phosphor and a red phosphor, The color or the color temperature of the light emitted from the light-emitting device 200 can be changed by modifying the composition, density, or thickness ratio of the first wavelength conversion layer 5' and the second wavelength conversion layer 5".

Figure 5:
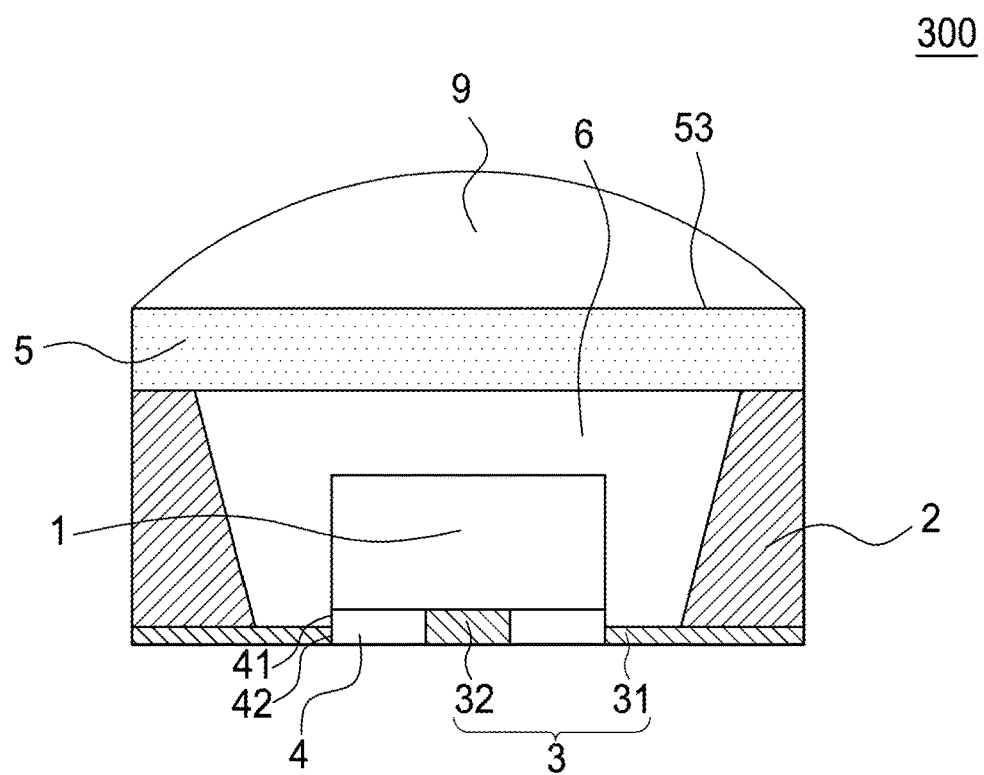
FIG. 5 shows a cross-sectional view of a light-emitting device in accordance with another embodiment of the present disclosure.

In another embodiment of the present disclosure, the light-emitting device 300 has an optical element disposed on the wavelength conversion structure 5, as shown in FIG. 5. The light-emitting device 300 has an optical element 9 disposed on the wavelength conversion structure 5. The optical element 9, such as a convex lens, a concave lens, a Fresnel lens, can change the light distribution of the light converted by the wavelength conversion structure 5 or to increase the brightness of the light-emitting device 300. The bottom surface of the optical element 9 contacts the top surface 53 of the wavelength conversion structure 5 and completely covers the transparent covering structure 6, the first reflective structure 2, and the light-emitting unit 1. In one embodiment, the optical element 9 has an arched convex surface. In other embodiments, the upper surface of the optical element 9 may have other shapes, such as an arched concave surface, a flat surface, a V-shaped concave surface, and a convex surface with a sharp point. The shapes mentioned above are not limited to the scope of the disclosure. The material of the optical element 9 includes sapphire, diamond, glass, epoxy, quartz, acrylic resin, silicon oxide ($SiO_x$), aluminum oxide ($Al_2O_3$), zinc oxide (ZnO), or silicone.

Figure 6:
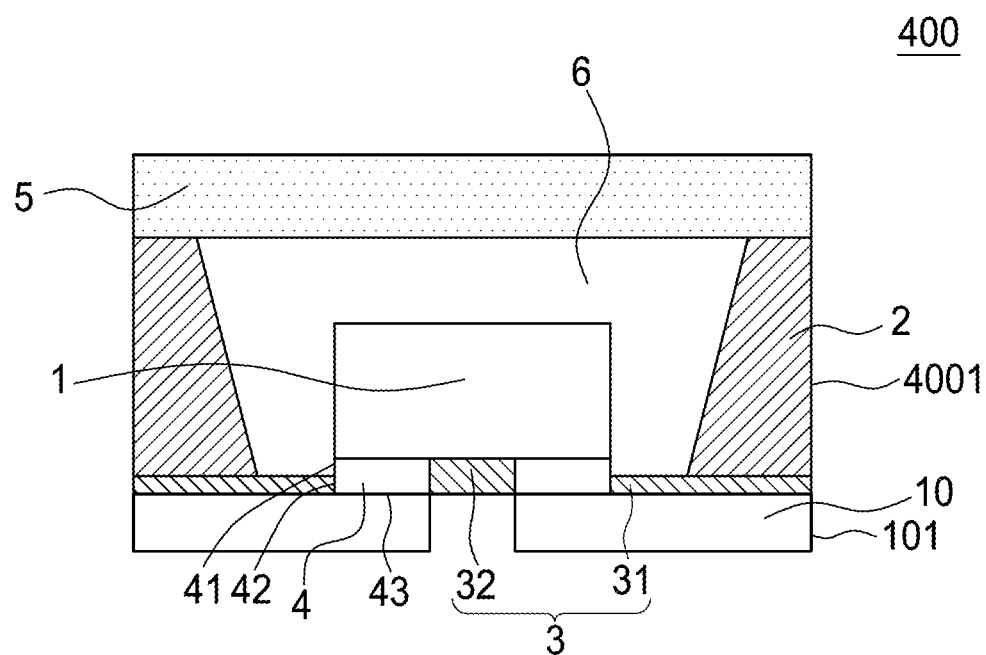
FIG. 6 shows a cross-sectional view of a light-emitting device in accordance with another embodiment of the present disclosure.

In another embodiment of the present disclosure, the extending electrode is disposed under the conductive electrode 4 of the light-emitting device 400, as shown in FIG. 6. The light-emitting device 400 has the extending electrodes 10 formed under the lower surfaces 43 of each of the conductive electrodes 4 and electrically connected to the conductive electrodes 4. The extending electrode 10 extends along the first portion 31 of the second reflective structure 3 toward the outmost surface 4001 of the light-emitting device 400. Specifically, the extending electrode 10 covers the bottom surface 43 of the conductive electrode 4 and the lower surface of the second reflective structure 3. The width or/and area of the extending electrode 10 is larger than that of the conductive electrode 4 to increase the convenience and reliability of the following assembling or welding. In one embodiment, the outmost side 101 of the extending electrode 10 is substantially coplanar with the outmost surface 4001. In another embodiment, the outmost side 101 of the extending electrode 10 is not coplanar with, shrinks from, or protrudes the outmost surface 4001 of the light-emitting device 400. The materials of the extending electrode 10 include metals, such as gold (Au), silver (Ag), copper (Cu), chromium (Cr), aluminum (Al), platinum (Pt), nickel (Ni), titanium (Ti), Tin (Sn), an alloy thereof, or a laminated combination thereof. In another embodiment (not shown), the second reflective structure 3 of the light-emitting device 400 has an arched bottom surface with an apex lower than the bottom surface 43 of the conductive electrode 4, so that a position which the extending electrode 10 contacts to the conductive electrode 4 is surrounded by the second reflective structure 3. If the first portion 31 of the second reflective structure 3 has an arched bottom surface, the extending electrode 10 covered thereon has a similar contour to the second reflective structure 3 and has an arched bottom or top surface.

Figure 7:
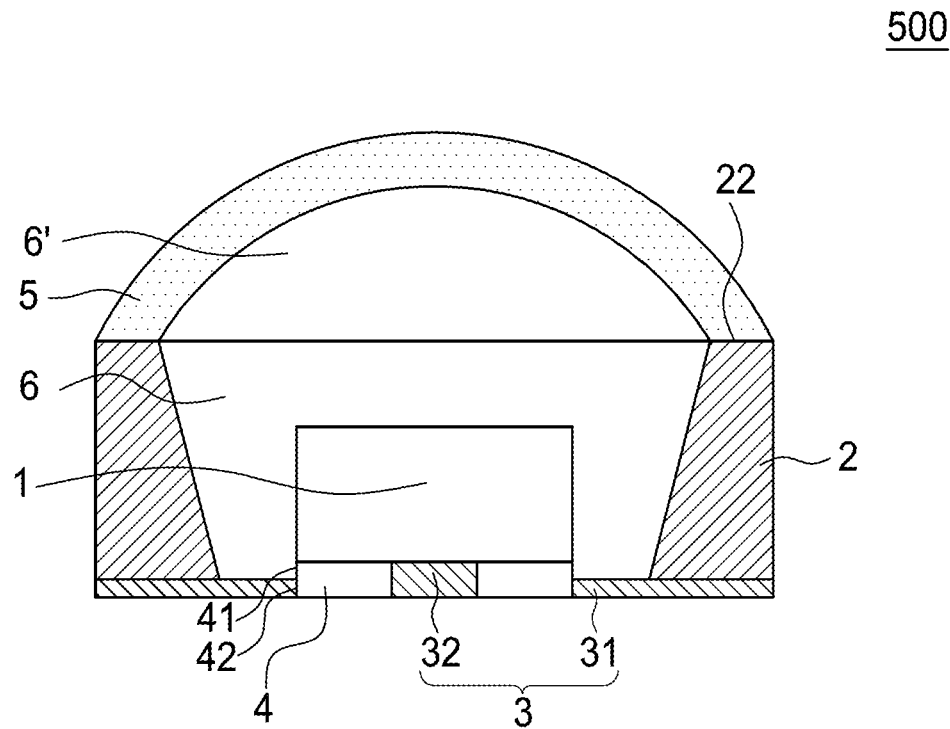
FIG. 7 shows a cross-sectional view of a light-emitting device in accordance with another embodiment of the present disclosure.

In another embodiment of the present disclosure, another sub-transparent covering structure 6' is located between the transparent covering structure 6 and the wavelength conversion structure 5 of the light-emitting device 500, as shown in FIG. 7. The light-emitting device 500 has a sub-transparent covering structure 6' disposed on the transparent covering structure 6 and completely covering the transparent covering structure 6 and the light-emitting unit 1. The wavelength conversion structure 5 is conformally formed on the sub-transparent covering structure 6', and completely covers the sub-transparent covering structure 6', the transparent covering structure 6, and the light-emitting main unit 1. The material of the sub-transparent covering structure 6' can be the same as or different from that of the transparent covering structure 6. The sub-transparent covering structure 6' does not contain the wavelength converting material, but may optionally contain diffusion particles. In one embodiment, the sub-transparent covering structure 6' and the transparent covering structure 6 are formed during a single manufacturing process, and the material of the sub-transparent covering structure 6' is the same as that of the transparent covering structure 6. As shown in FIG. 7, since the sub-transparent covering structure 6' has an arched convex surface, the distance between the light-emitting unit 1 and the wavelength conversion structure 5 is similar in every direction, so that the distance of the route of the light emitted from the light-emitting unit 1 toward the wavelength conversion structure 5 is more uniform. Furthermore, the light characteristics (for example, light intensity, color temperature, or color) of the light-emitting device 500 are more uniform at each view angle. The light emitted from the light-emitting unit 1 is changed by the sub-transparent covering structure 6' first and converted or mixed by the wavelength conversion structure 5 to change the light distribution. The structure of the sub-transparent covering structure 6' can be different depending on the desired light distribution. For example, the structure can be a concave lens, a Fresnel lens, a square structure, a cylinder structure, a frustum structure, etc., the above structures are not limited to be present disclosure.

Figure 8A:
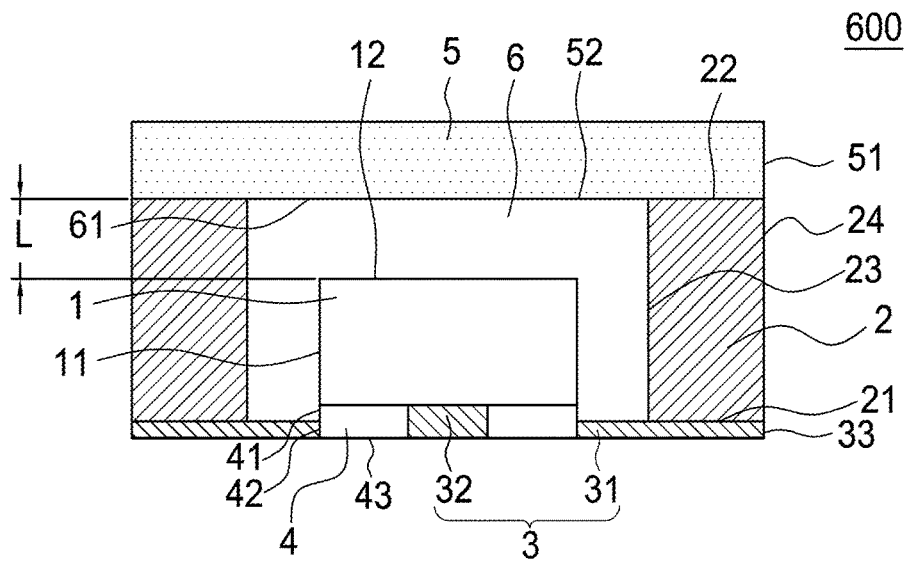
FIG. 8A shows a cross-sectional view of a light-emitting device in accordance with another embodiment of the present disclosure.

FIG. 8A shows a cross-sectional view of a light-emitting device in accordance with another embodiment of the present disclosure. The light-emitting device 600 includes a light-emitting unit 1, a first reflective structure 2, a second reflective structure 3, a transparent covering structure 6, and a wavelength conversion structure 5. The light-emitting unit 1 has a light-emitting surface 12, two (positive and negative) conductive electrodes 4 located on the bottom surface which is opposite to the light-emitting surface 12 of the light-emitting unit 1, and a plurality of side surfaces 11. The conductive electrode 4 includes an upper portion 41 closer to the light-emitting surface 12 and a lower portion 42 further from the light-emitting surface 12. Besides, an outmost edge of the conductive electrode 4 does not exceed the outmost edge of the side surface 11 (that is, the conductive electrode 4 may be coplanar with or shrunk from the outmost edge of the side surface 11). The first reflective structure 2 surrounds the side surface 11 of the light-emitting unit 1 and the upper portion 41 of the conductive electrode 4. The first reflective structure 2 has a bottom surface 21, a top surface 22, an inner surface 23, and an outer surface 24 with a similar reflection coefficient to that of the inner surface 23. The inner surface 23 of the first reflective structure 2 is substantially perpendicular to the bottom surface 21, and the top surface 22 has a different horizontal height from the light-emitting surface 12 of the light-emitting unit 1. Besides, the top surface 22 is located above the light-emitting surface 12 and has a height difference L which is greater than zero to the light-emitting surface 12. The second reflective structure 3 is located below the first reflective structure 2 and substantially perpendicular to the first reflective structure 2. The second reflective structure 3 includes a first portion 31 surrounding the lower portion 42 of the conductive electrode 4 (in bottom view as shown in FIG. 1B) and a second portion 32 located in a space between the two conductive electrodes 4. An end of the first portion 31 close to the light-emitting unit 1 covers an outer side surface of the lower portion 42 of the conductive electrode 4, and the top surface of the first portion 31 is located below the first reflective structure 2 and has a portion directly contacting the bottom surface 21. The second portion 32 is filled in the region between the two conductive electrodes 4, and covers a portion of the light-emitting unit 1 which is located between the conductive electrodes 4. Besides, both ends of the second portion 32 directly contact respective side surfaces of each of the conductive electrodes 4. In another embodiment, the first reflective structure 2 and the second reflective structure 3 are collectedly formed by a single manufacturing process. The bottom surface of the second reflective structure 3 is substantially coplanar with the bottom surface 43 of the conductive electrode 4. In another embodiment, the second reflective structure 3 has an arched bottom surface such that the bottom surface of the second reflective structure 3 may be lower or higher than the lower surface 43 of the conductive electrode 4.

Figure 8B:
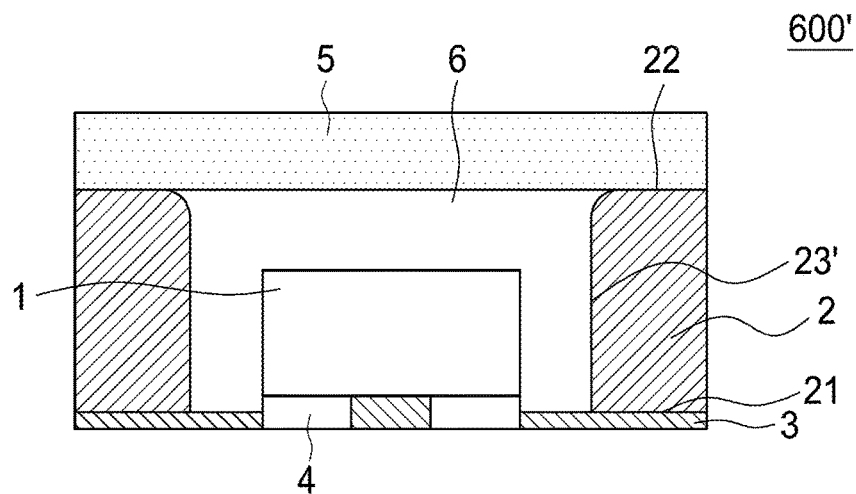
FIG. 8B shows a cross-sectional view of a light-emitting device in accordance with another embodiment of the present disclosure.
Figure 8C:
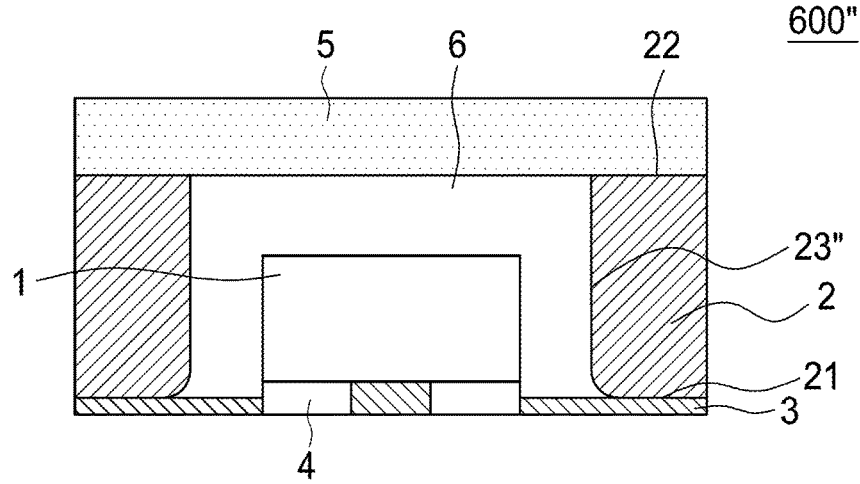
FIG. 8C shows a cross-sectional view of a light-emitting device in accordance with another embodiment of the present disclosure.

In an embodiment, the transparent covering structure 6 of the light-emitting device 600 with or without wavelength converting material is located among the first reflective structure 2, the second reflective structure 3, and the light-emitting unit 1. The transparent covering structure 6 surrounds the side surfaces 11 of the light-emitting unit 1 and the upper portion 41 of the conductive electrode 4, and fully covers the light-emitting surface 12. The wavelength conversion structure 5 is disposed above the transparent covering structure 6 and covers the first reflective structure 2, the transparent covering structure 6, and the light-emitting unit 1. The bottom surface 52 of the wavelength conversion structure 5, the top surface 61 of the transparent covering structure 6, and the top surface 22 of the first reflective structure 2 are substantially coplanar and joined to each other. In other words, the transparent covering structure 6 fills between the first reflective structure 2, the second reflective structure 3, and the wavelength conversion structure 5, and also surrounds the light-emitting unit 1. The side surface 51 of the wavelength conversion structure 5, the outer surface 24 of the first reflective structure 2, and the outer surface 33 of the second reflective structure 3 are substantially coplanar (align to each other with a line in at least one cross-sectional view as shown in FIG. 8A). In another embodiment, the outer surface 33 of the second reflective structure 3 is not coplanar to the outer surface 24 of the first reflective structure 2 and is located under the bottom surface 21 of the first reflective structure 2. Despite that, the periphery of the transparent covering structure 6 is fully surrounded by the wavelength conversion structure 5, the first reflective structure 2, and the second reflective structure 3, and does not in contact with the ambiance. Accordingly, the light emitted from the light-emitting unit 1 is reflected by the first reflective structure 2 and the second reflective structure 3 toward the top surface 61 of the transparent covering structure 6, then converted and/or mixed by the wavelength conversion structure 5, so that the light-emitting device 600 emits light upwardly. When the transparent covering structure 6 includes the wavelength converting materials which can convert the light emitted from the light-emitting unit 1, the wavelength converting material in the wavelength conversion structure 5 are the same as that in the transparent covering structure 6. When the materials are the same, the concentration of the wavelength converting materials in the wavelength conversion structure 5 can differ from that in the transparent covering structure 6. The wavelength converting materials in the transparent covering structure 6 can also be different from that in the wavelength conversion structure 5. For example, the wavelength conversion structure 5 includes the phosphor with a shorter emission wavelength (for example, yellow/yellow-greenish phosphor) or the phosphor with a longer emission wavelength (for example, red phosphor). In another embodiment, between adjacent conductive electrodes 4, the transparent covering structure 6 fills in between the second portion 32 of the second reflective structure 3 and the light-emitting unit 1. The manufacturing process of the light-emitting device 600 can refer to the corresponding descriptions of FIG. 2 and FIG. 3. The blade can be a blade without incline to dice the transparent covering structure 6, then the transparent covering structure 6 has width of the upper portion same as that of the lower portion as shown in FIG. 8A. In another embodiment, when the light-emitting unit 600 is manufactured according to the procedure refer to FIG. 2 or FIG. 3 and using a blade without incline but with the tip having an arc-shaped shape in a cross-sectional view, the light-emitting device has a structure as light-emitting device 600' as shown in FIG. 8B. The inner surface 23' of the first reflective structure 2 has an arc-shaped surface near the wavelength conversion structure 5. In more details, the top surface 22 of the first reflective structure 2 of the light-emitting device 600' has a width smaller than that of the bottom surface 21 of the first reflective structure 2 of the light-emitting device 600'. FIG. 8C shows a cross-sectional view of a light-emitting device in accordance with another embodiment. The inner surface 23" of the first reflective structure 2 has an arc-shaped surface near the second reflective structure 3. In more details, the bottom surface 21 of the first reflective structure 2 of the light-emitting device 600" has a width smaller than the top surface 22 of the first reflective structure 2 of the light-emitting device 600". The method of manufacturing the light-emitting device 600" may be referred to the following descriptions of FIGS. 9A-9G.

The wavelength conversion structure 5 of the light-emitting device 600 can be a single-layer structure or a multilayer structure, if it is a multilayer structure, the detail of structure can refer to the corresponding descriptions disclosed in FIG. 4. Further, the light-emitting device 600 can also have an optical element disposed above the wavelength conversion structure 5, which can be referred to FIG. 5 and its corresponding descriptions. The light-emitting device 600 can also have the extending electrode under the conductive electrode 4, which can be referred to FIG. 6 and its corresponding descriptions. The light-emitting device 600 may have a sub-transparent covering structure between the transparent covering structure 6 and the wavelength conversion structure 5, which can be referred to FIG. 7 and its corresponding descriptions.

Figure 9A:
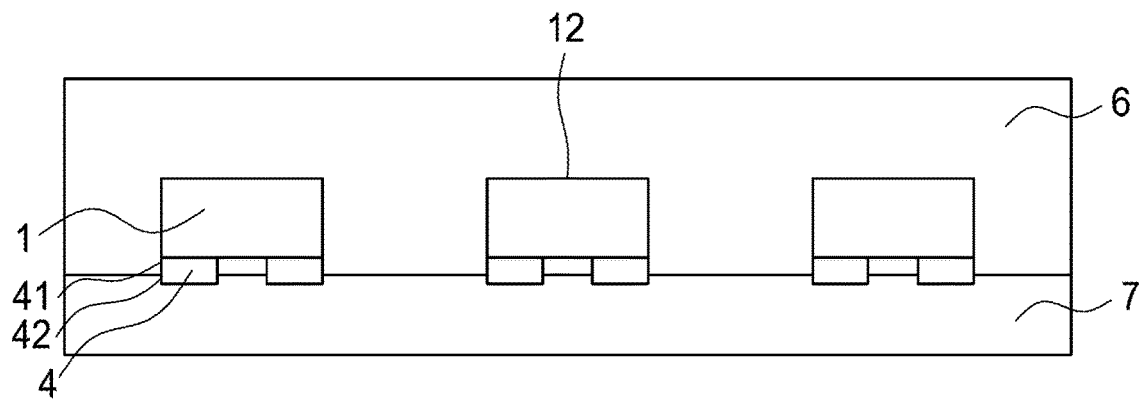
FIGS. 9A~9G show drawings of manufacturing a light-emitting device in accordance with another embodiment of the present disclosure.
Figure 9B:
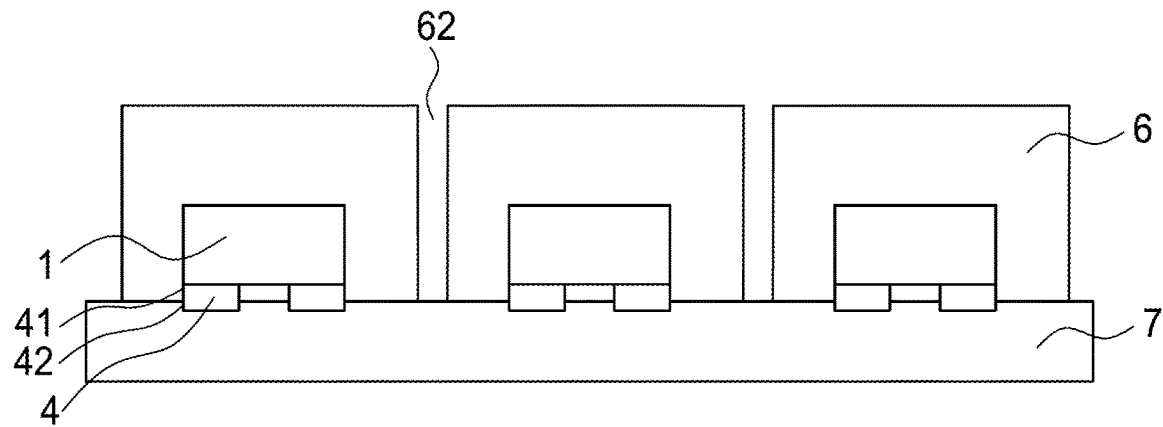

FIGS. 9A~9H show a manufacturing flow of a light-emitting device in according with an embodiment of the present disclosure. The same reference numerals, symbols are same as those in the above-described production flow are described in the foregoing description present similar or the same elements or devices, and the description thereof will be omitted. As shown in FIG. 9A, a first temporary carrier 7 which is adhesive is provided. Two conductive electrodes 4 of the plurality of light-emitting units 1 are disposed on the first temporary carrier 7. The lower portion 42 of the conductive electrode 4 is embedded in the first temporary carrier 7. An area which is between the adjacent light-emitting units 1 is defined as an aisle. Then the transparent covering structure 6 is formed to fill in the aisle between the adjacent light-emitting units 1 and cover the light-emitting surface 12 of the light-emitting unit 1 and the upper surface of the first temporary carrier 7 which is not covered by the light-emitting unit 1. As shown in FIG. 9B, the transparent covering structure 6 is diced by a blade to form a cutting track 62. To be more specific, the blade may create cuts on first temporary carrier 7, but does not substantially separate the first temporary carrier 7 in the cutting track 62. In other words, each light-emitting unit 1 which is covered by the transparent covering structure 6 is adhered to the first temporary carrier 7. As aforementioned description disclosed, the blade can have inclined shape to manufacture a light-emitting device which has the transparent covering structure 6 with a converted trapezoidal shape as shown in FIG. 1A. Or the blade can be without inclined shape to manufacture a light-emitting device with a substantially rectangle transparent covering structure 6 as shown in FIG. 8A.

Figure 9C:
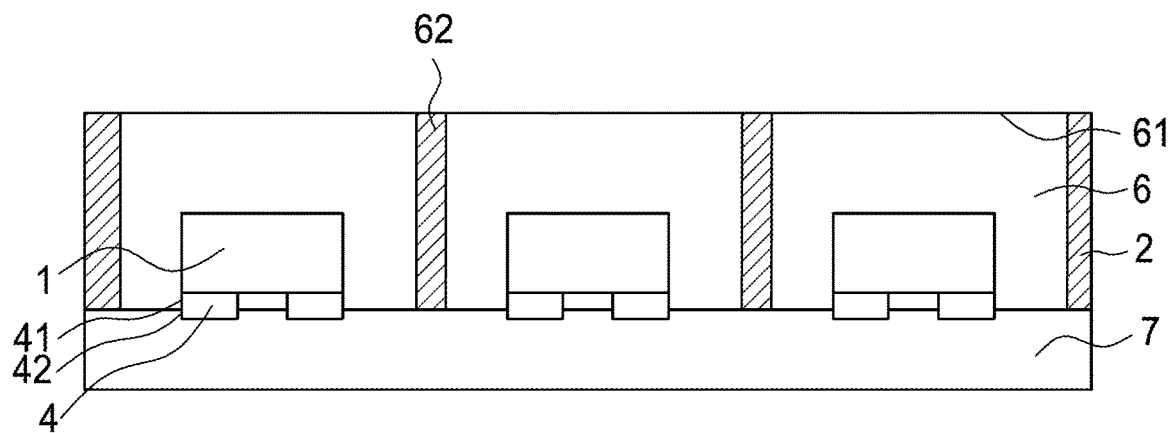
Figure 9D:
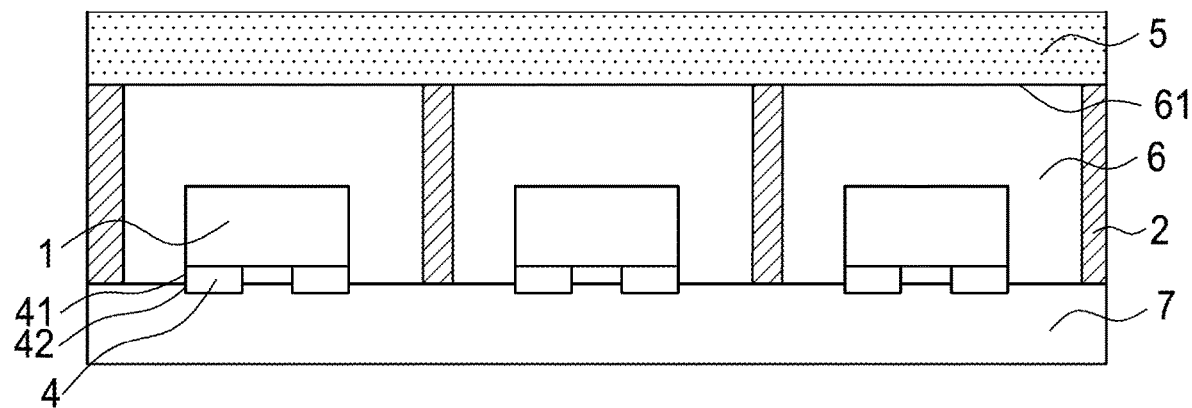
Figure 9E:
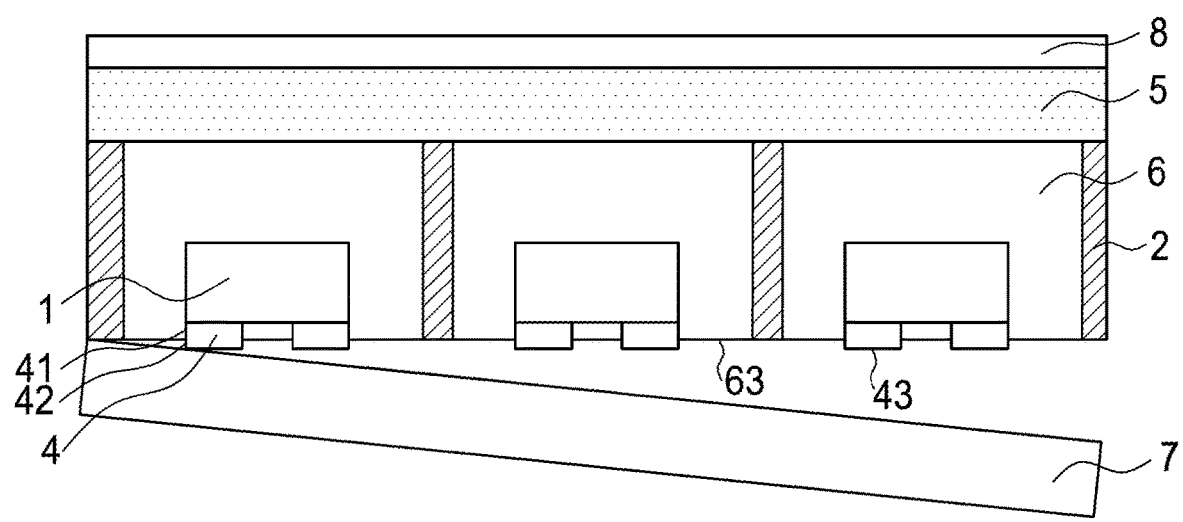
Figure 9F:
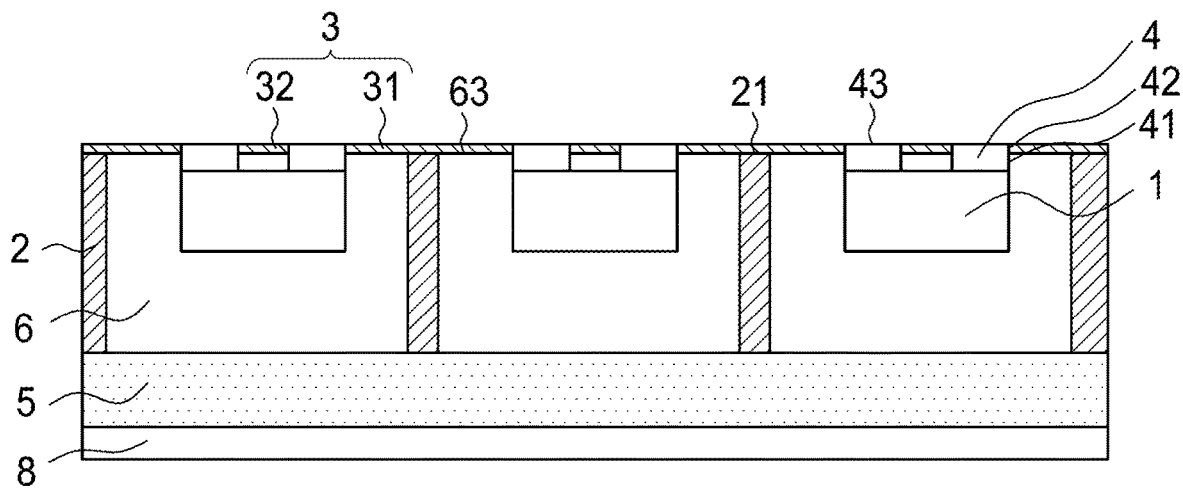
Figure 9G:
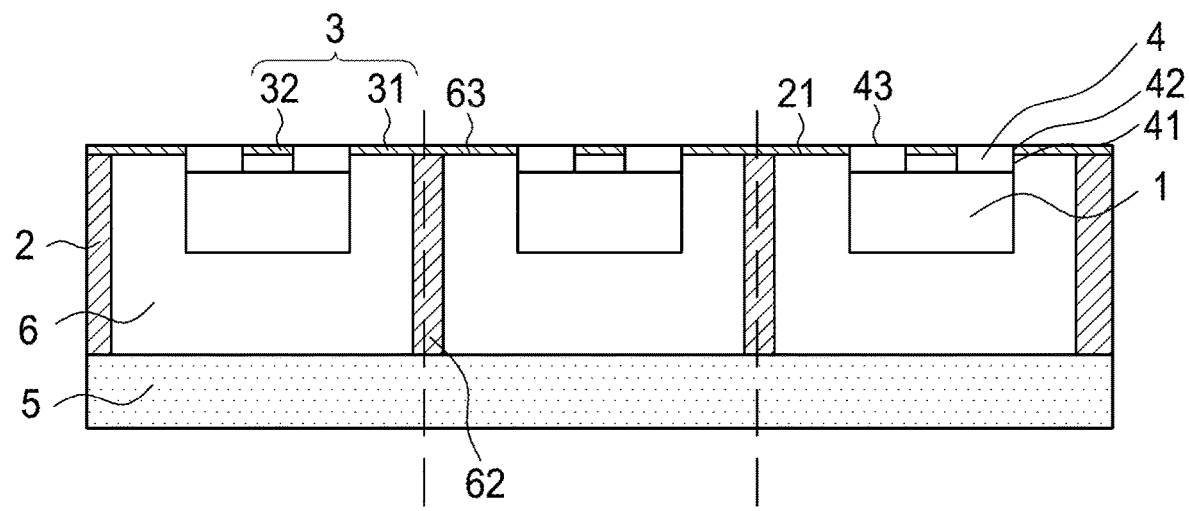

As shown in FIG. 9C, the first reflective structure 2 is formed in the cutting track 62. Here, a polish process may also be performed to flatten the top surface 61 of the transparent covering structure 6. In addition, the polish process can also clean the first reflective structure 2 that overflows on the transparent covering structure 6. Next, as shown in FIG. 9D, the wavelength conversion structure 5 is formed on the top surface 61 of the transparent covering structure 6 and the first reflective structure 2. As shown in FIG. 9E, a second temporary carrier 8 which is adhesive is adhered to a surface opposite to the first temporary carrier 7 of the wavelength conversion structure 5. Thereafter, the first temporary carrier 7 is removed and the lower portion 42 and the bottom surface 43 of the conductive electrode 4 and the bottom surface 63 of the transparent covering structure 6 are exposed. It is noted that the bottom surface 63 of the transparent covering structure 6 is not coplanar with the bottom surface 43 of the conductive electrode 4. To be more specific, the lower portion 42 of the conductive electrode 4 is protruded from the transparent covering structure 6. Next, as FIG. 9F shows, the structure shown in FIG. 9E is reversed. The second reflective structure 3 is formed on the other side of the transparent covering structure 6 which is opposite to the second temporary carrier 8 to surround the outer surface of the conductive electrode 4 and cover the bottom surface 63 of the transparent covering structure 6 and the bottom surface 21 of the first reflective structure 2. The second reflective structure 3 does not cover the entire bottom surface 43 of the conductive electrode 4. As shown in FIG. 9G, a dicing process is performed on the first reflective structure 2 and the wavelength conversion structure 5 in the cutting tracks 62, and then the second temporary carrier 8 is removed to separate the plurality of light-emitting devices. In another embodiment, in the step disclosed in FIG. 9B, when the tip of the blade has an arc-shaped shape in a cross-sectional view, the transparent covering structure 6 has an arc-shaped surface near the first temporary carrier 7 to form a light-emitting device shown in FIG. 8C. The inner surface 23" of the first reflective structure 2 has an arc-shaped surface near the second reflective structure 3.

Figure 10:
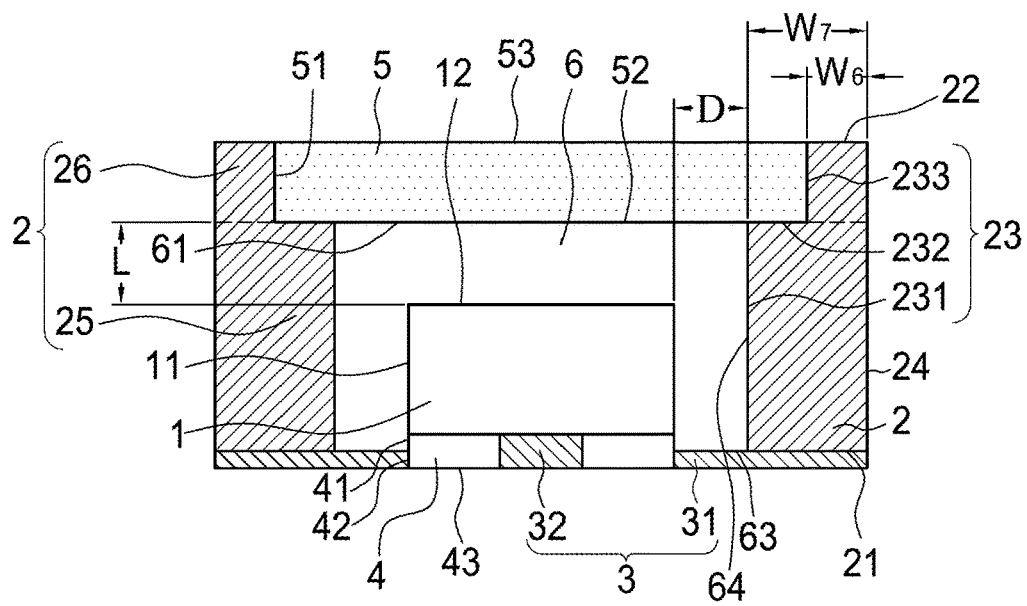
FIG. 10 shows a cross-sectional view of a light-emitting device in accordance with another embodiment of the present disclosure.

FIG. 10 shows a cross-sectional view of a light-emitting device in accordance with another embodiment disclosed in the present application. The light emitting device 700 includes a light-emitting unit 1, a first reflective structure 2, a second reflective structure 3, a transparent covering structure 6, and a wavelength conversion structure 5. The light-emitting unit 1 has a light-emitting surface 12, the two conductive electrodes 4 located on the bottom surface which is opposite to the light-emitting surface 12 of the light-emitting unit 1, and a plurality of side surfaces 11. The conductive electrode 4 includes an upper portion 41 closer to the light-emitting surface 12 and a lower portion 42 further from the light-emitting surface 12. Besides, an outmost edge of the conductive electrode 4 does not exceed the outmost edge of the side surface 11 (that is, the conductive electrode 4 may be coplanar with or shrunk from the outmost edge of the side surface 11). The transparent covering structure 6 with or without wavelength converting material surrounds the side surface 11 and the upper portion 41 of the conductive electrode 4 and fully covers the light-emitting surface 12. The top surface 61 of the transparent covering structure 6 is located above and separated from the light-emitting surface 12 of the light-emitting unit 1 with a distance L which is greater than zero. The wavelength conversion structure 5 is located above and covers transparent covering structure 6 and the light-emitting unit 1. The wavelength conversion structure 5 has a larger width than that of the transparent covering structure 6. In more details, the side surface 64 of the transparent covering structure 6 is not coplanar with the side surface 51 of the wavelength conversion structure 5 (the side surface 64 is not aligned with the side surface 51 in a line as shown in FIG. 10). The side surface 64 is closer to the light-emitting unit 1 than the side surface 51. The side surface 64 of the transparent covering structure 6 is substantially perpendicular to the bottom surface 52 of the wavelength conversion structure 5. The top surface 61 of the transparent covering structure 6 substantially contacts the bottom surface 52 of the wavelength conversion structure 5. The first reflective structure 2 surrounds the transparent covering structure 6 and the wavelength conversion structure 5 and has the inner surface 23 and the outer surface 24 with similar reflection coefficients. The bottom surface 21 of the first reflective structure 2 is substantially coplanar with and contacts the bottom surface 63 of the transparent covering structure 6. Furthermore, the width of the first reflective structure varies. The inner surface 23 of the first reflective structure 2 has three portions 231, 232, 233 which are not aligned in a line. The first portion 231 and the third portion 233 are substantially parallel to the side surface 11. The second portion 232 connects the first portion 231 and the third portion 233 and is perpendicular to the first portion 231 and the third portion 233. The first portion 231 of the inner surface 23 is substantially perpendicular to the bottom surface 21 and surrounds the transparent covering structure 6. To be more specific, the first portion 231 contacts the side surface 64 of the transparent covering structure 6 but does not contact the side surface 11. The second portion 232 contacts the bottom surface 52 of the wavelength conversion structure 5. To be more specific, the second portion 232 is overlapped with a portion of the bottom surface 52 closer to the side surface 51. The third portion 233 surrounds and contacts the side surface 51 of the wavelength conversion structure 5. The first portion 231 has a distance W7 to the outer surface 24. The third portion 231 has a distance W6 to the outer surface 24. W7 is different from and greater than W6. W7 is more than 1.3 times of W6, preferably, more than 2 times of W6. In an embodiment, W7=100 μm or 129 μm, W6=45.2 μm or 82.8 μm. The top surface 22 of the first reflective structure 2 is substantially coplanar with the top surface 53 of the wavelength conversion structure 5. Thus, the wavelength conversion structure 5 is disposed within the first reflective structure 2 and exposes the top surface 53. The contact surface of the first reflective structure 2 and the wavelength conversion structure 5 forms an L-shaped appearance. In other words, the second portion 232 and the third portion 233 form an L-shaped appearance (in the cross-sectional view as shown in FIG. 10).

Referring to FIG. 10, in an embodiment, the second reflective structure 3 is located under and substantially perpendicular to the first reflective structure 2. The second reflective structure 3 includes a first portion 31 surrounding the lower portion 42 of the conductive electrode 4 and a second portion 32 covering an area between two conductive electrodes 4. Further, the first portion 31 has a first end and a top surface, while the first end is close to the light-emitting unit 1 and covers an outer surface of the lower portion 42 of the conductive electrode 4; the top surface is located under the first reflective structure 2 and directly contacts the bottom surface 21, 63. The second portion 32 is filled in an area between two conductive electrodes 4 and has two ends directly contacting the side surface of the conductive electrode 4. Therefore, the bottom surface of the light-emitting unit 1 has a portion not covered by the conductive electrodes 4 being fully or partially covered by the second reflective structure 3. In another embodiment, the first reflective structure 2 and the second reflective structure 3 are formed by one manufacturing process. The bottom surface of the second reflective structure 3 is coplanar with each bottom surface 43 of two conductive electrodes 4. In another embodiment, the second reflective structure 3 has a curved bottom surface; therefore, the bottom surface of the second reflective structure 3 is generally higher or lower than the bottom surface 43 of the conductive electrode 4. In another embodiment, the transparent covering structure 6 is located in a space among the adjacent conductive electrodes 4, the second portion 32 of the second reflective structure 3, and the light-emitting unit 1. The light emitted from the light-emitting unit 1 is reflected by the first reflective structure 2 and the second reflective structure 3 toward the top surface 61 of the transparent covering structure 6, then converted and/or mixed by the wavelength conversion structure 5, so that the light-emitting device 700 emits light upwardly. When the transparent covering structure 6 includes a wavelength converting materials which can convert the light emitted from the light-emitting unit 1, the wavelength converting material in the wavelength conversion structure 5 are the same as that in the transparent covering structure 6. When the materials are the same, the concentration of the wavelength converting materials in the wavelength conversion structure 5 can differ from that in the transparent covering structure 6. The wavelength converting materials in the transparent covering structure 6 can also be different from that in the wavelength conversion structure 5. For example, the wavelength conversion structure 5 includes the phosphor with a shorter emission wavelength (for example, yellow/yellow-greenish phosphor) or the phosphor with a longer emission wavelength (for example, red phosphor). The first reflective structure 2 of the light-emitting device 700 surrounds the wavelength conversion structure 5, therefore, the emitting angle of the light-emitting device 700 is smaller than that of the light-emitting devices 100~600. In one embodiment, the emitting angle of the light-emitting device 700 is less than 125 degree, preferably not more than 120 degree. The emitting angle described here is defined as the angular range from the maximum light intensity down to 50% of the maximum light intensity. The detailed descriptions of the emitting angle can refer to Taiwan Application Ser. No. 104103105 and be incorporated herein by reference. In another embodiment, the light-emitting device 700 does not have the second reflective structure 3 so that the lower portion 42 of the two conductive electrodes 4 is exposed.

Figure 11:
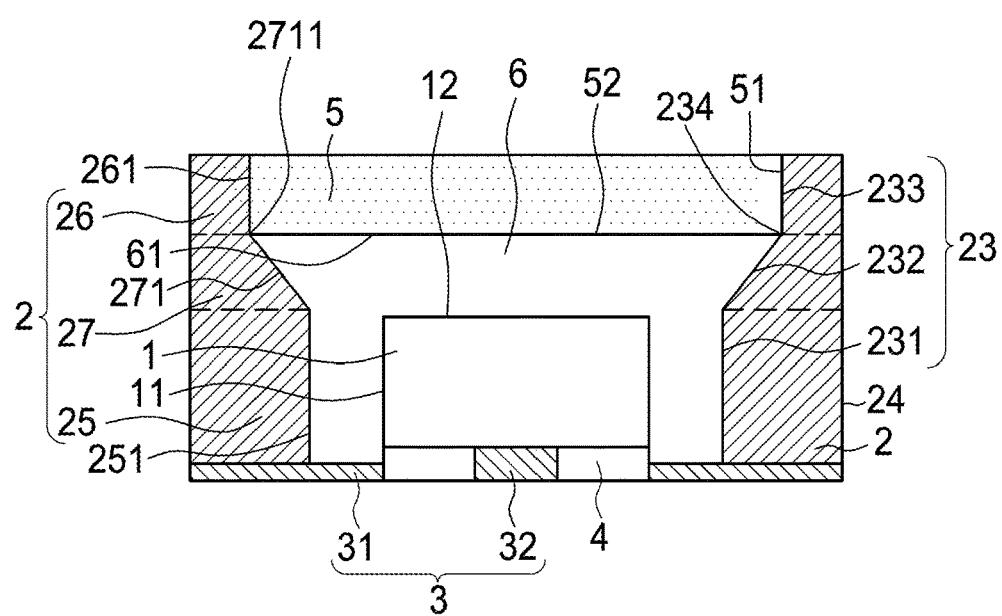
FIG. 11 shows a cross-sectional view of a light-emitting device in accordance with another embodiment of the present disclosure.

In another embodiment, the second portion 232 of the inner surface of the first reflective structure 2 can be inclined as shown in FIG. 11. In FIG. 11, the light-emitting device 800 is similar to the light-emitting device 700 and includes a light-emitting unit 1, a first reflective structure 2, a second reflective structure 3, a transparent covering structure 6, and a wavelength conversion structure 5. The inner surface 23 of the first reflective structure 2 has three portions 231, 232, 233 which are not aligned in a line. The first portion 231 and the third portion 233 are substantially parallel to the side surface 11. The second portion 232 connects and is not perpendicular to the first portion 231 and the third portion 233. The distance between the second portion 232 and the outer surface 24 decreases along the direction from the first portion 231 to the third portion 233. An end 234 of the second portion 232 contacts the third portion 233. In other words, as FIG. 11 shows, the bottom surface 52 of the wavelength conversion structure 5 does not contact the first reflective structure 2, and the width of the top surface 61 of the transparent covering structure 6 is substantially equal to that of the bottom surface 52 of the wavelength conversion structure 5. Therefore, the upper portion of the transparent covering structure 6 which is closer to the wavelength conversion structure 5 has a trapezoidal shape. The width of the transparent covering structure 6 increases along the direction from the first portion 231 to the third portion 233. In another embodiment, the inner surface comprises a fourth portion (not shown) connecting the second portion and the third portion and fully contacting a portion of the bottom surface which is close to and connects the side surface of the wavelength conversion structure. The fourth portion and the third portion form an L-shaped appearance. Therefore, a portion of the bottom surface of the wavelength conversion structure close to the side surface contacts the first reflective structure. It appears to be an L-shaped contact between the first reflective structure and the wavelength conversion structure in a cross-sectional view similar to that shown in FIG. 10. The inclined surface of the inner surface of the first reflective structure can enhance the brightness of the light-emitting device. The detailed descriptions of the light-emitting unit 1, the second reflective structure 3, the transparent covering structure 6, and the wavelength conversion structure 5 can be referred to the corresponding aforementioned descriptions of the light-emitting device 700.

The wavelength conversion structure 5 of the light-emitting device 700 or 800 can be a single-layer or a multilayer structure. If it is the multilayer structure, the detailed descriptions can be referred to the corresponding description of FIG. 4. If the light-emitting device 700 or 800 has an optical element disposed above the wavelength conversion structure 5, and the detailed descriptions can be referred to the corresponding description of FIG. 5. If the light-emitting device 700 or 800 has the extending electrode under the conductive electrode 4, and the detailed description can be referred to the corresponding description of FIG. 6. If the light-emitting device 700 or 800 has a sub-transparent covering structure between the transparent covering structure 6 and the wavelength conversion structure 5, and the detailed description can be referred to the corresponding description of FIG. 7.

Figure 12A:
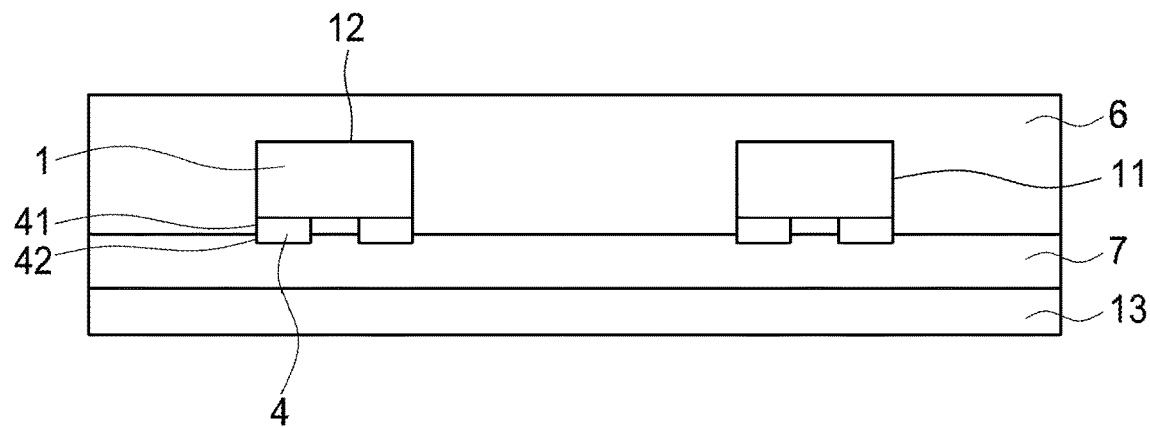
FIGS. 12A~12I show drawings of manufacturing a light-emitting device in accordance with an embodiment of the present disclosure.
Figure 12B:
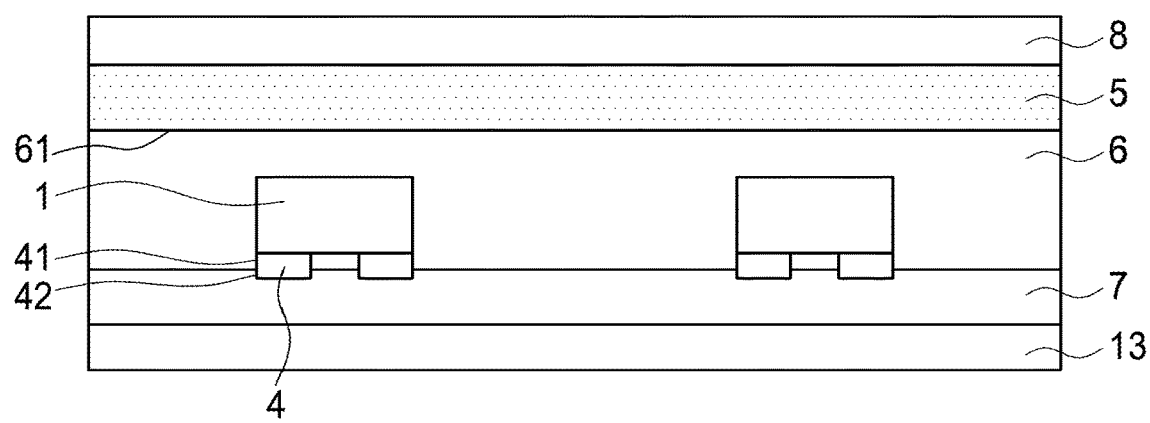
Figure 12C:
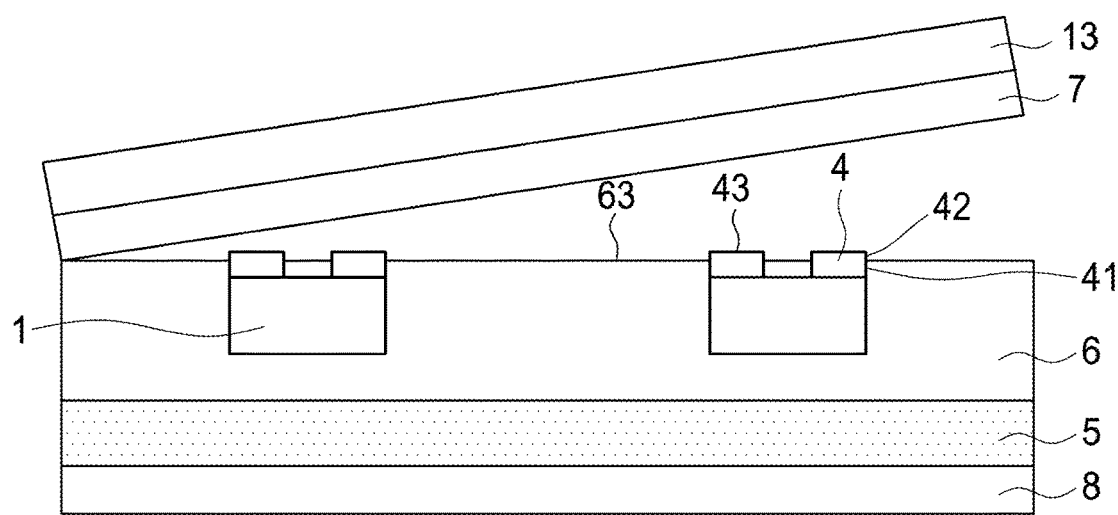
Figure 12D:
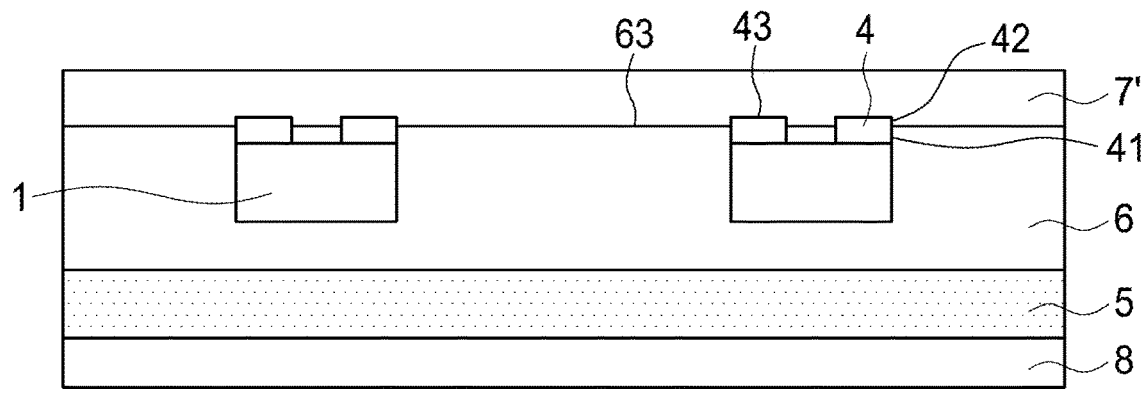

FIGS. 12A~12I show a manufacturing flow of a light-emitting device 700 in accordance with an embodiment of the present disclosure. As shown in FIG. 12A, a substrate 13 is provided and a first temporary carrier 7 which is adhesive is disposed thereon. Two conductive electrodes 4 of the plurality of light-emitting units 1 are adhered to the substrate 13 by the first temporary carrier 7. The lower portion 42 of the conductive electrode 4 is embedded in the first temporary carrier 7. An area which is between the adjacent light-emitting units 1 is defined as an aisle. Then the transparent covering structure 6 is formed to fill in the aisle between the adjacent light-emitting units 1 and cover the light-emitting surface 12 of the light-emitting unit 1 and the upper surface of the first temporary carrier 7 which is not covered by the light-emitting unit 1. The material of the substrate 13 can be a transparent hard material such as glass or sapphire. As shown in FIG. 12B, the wavelength conversion structure 5 is formed on the top surface 61 of the transparent covering structure 6. Then, a second temporary carrier 8 which is adhesive is adhered to the wavelength conversion structure 5. Next, as FIG. 12C shows, the structure shown in FIG. 12B is reversed, and first temporary carrier 7 and the substrate 13 are removed to separate the light-emitting unit 1 and the transparent covering structure 6 from the substrate 13. The lower portion 42 and the bottom surface 43 of the conductive electrode 4, and the bottom surface 63 of the transparent covering structure 6 are exposed. The removing method may be a laser lift off, heating separation, dissolution, or the like. Thereafter, as FIG. 12D shows, a fourth temporary carrier 7' is adhered to a side of the conductive electrode 4 and the transparent covering structure 6 which is opposite to the second temporary carrier 8. The fourth temporary carrier 7' has similar material characteristics as the first temporary carrier 7, and the lower portions 42 of each of the conductive electrodes 4 are embedded in the fourth temporary carrier 7'.

Figure 12E:
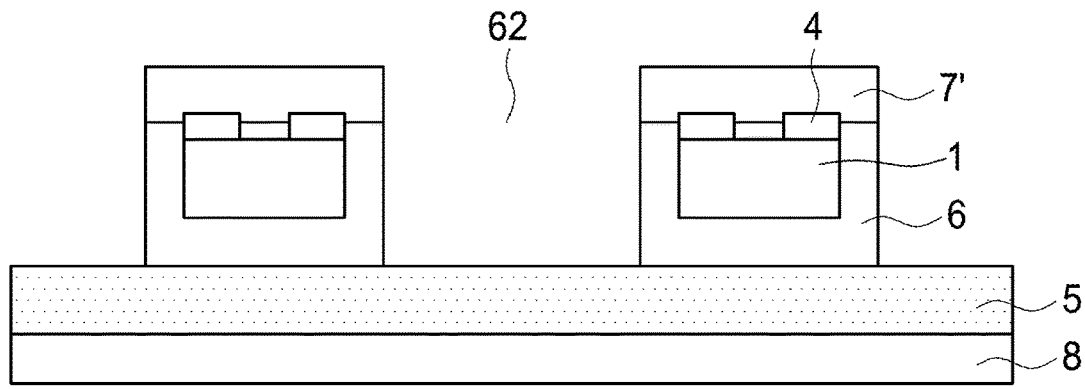
Figure 12F:
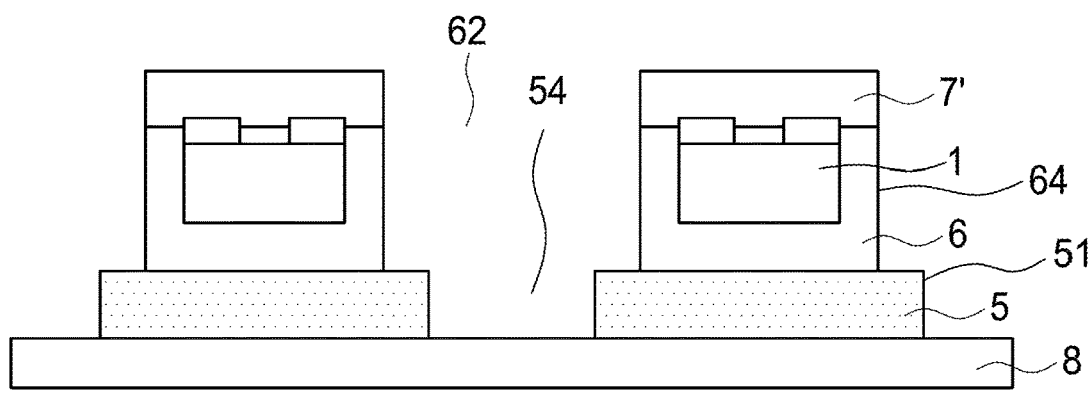
Figure 12G:
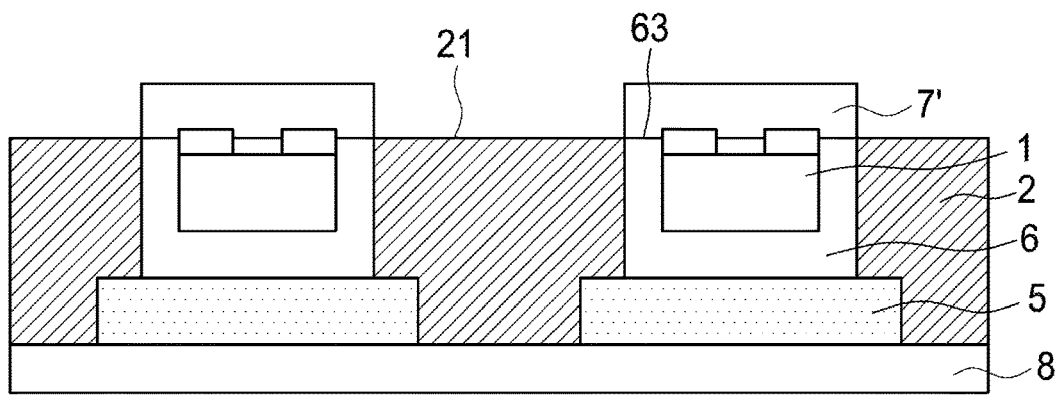
Figure 12H:
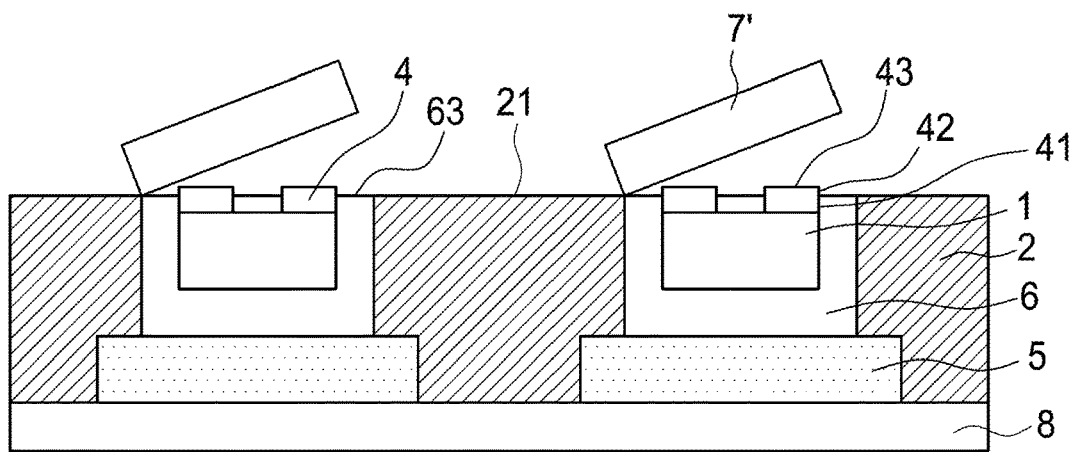
Figure 12I:
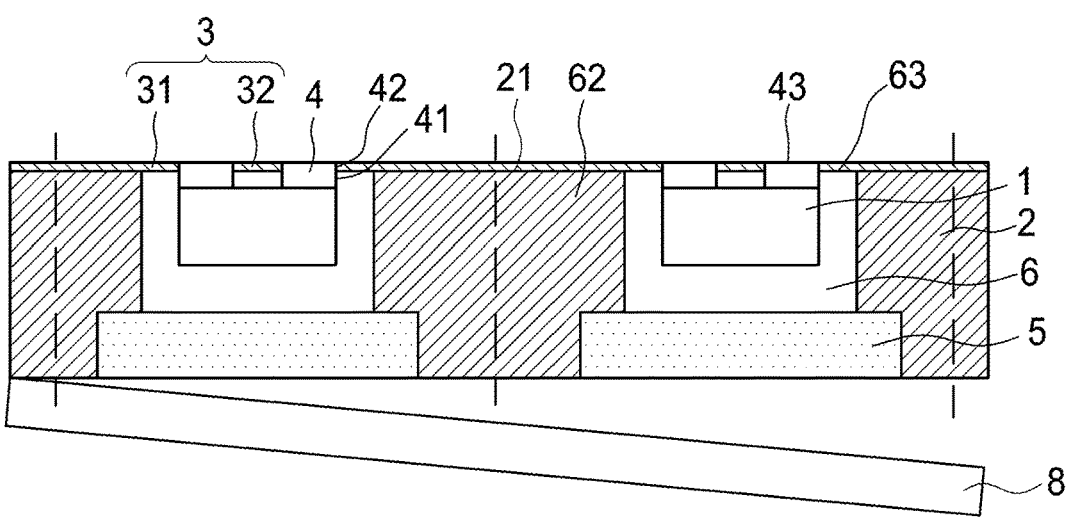

Subsequently, as FIG. 12E shows, the fourth temporary carrier 7' and the transparent covering structure 6 are diced by a blade to form a cutting track 62. The blade may create cuts on the wavelength conversion structure 5, but not substantially separate the wavelength conversion structure 5 in the cutting track 62. In other words, each light-emitting unit 1 which is covered by the transparent covering structure 6 is adhered to the wavelength conversion structure 5. Next, as FIG. 12F shows, the wavelength conversion structure 5 located in the cutting track 62 is diced by another blade that has narrower width to form a sub-cutting track 54 which is narrower than the cutting track 62. In other words, the cutting track 62 and the sub-cutting track 54 which have two different widths form the transparent covering structure 6 having a narrower width than wavelength conversion structure 5. The blade that has narrower width may create cuts on the second temporary carrier 8, but not substantially separate the second temporary carrier 8. In other words, each light-emitting unit 1 which is covered by the transparent covering structure 6 and the wavelength conversion structure 5 which is already separated are adhered to the second temporary carrier 8. Subsequently, as FIG. 12G shows, the first reflective structure 2 is formed in the cutting track 62 and the sub-cutting track 54 by means of steel plate printing, coating, brushing, spin coating, ink jet printing, dispensing, sputtering, molding or the like to make the bottom surface 21 of the first reflective structure 2 substantially coplanar with the bottom surface 63 of the transparent covering structure 6. As shown in FIG. 12H, the fourth temporary carrier 7' is removed to expose the lower portion 42 and the bottom surface 43 of the conductive electrode 4 and the bottom surface 63 of the transparent covering structure 6. Then, as FIG. 12I shows, the second reflective structure 3 is formed on the other side of the transparent covering structure 6 which is opposite to the second temporary carrier 8 by means of steel plate printing, coating, brushing, spin coating, inkjet printing or the like to surround the outer surface of the conductive electrode 4 and to cover the bottom surface 63 of the transparent covering structure 6 and the bottom surface 21 of the first reflective structure 2. The second reflective structure 3 does not cover the entire bottom surface 43 of the conductive electrode 4. As shown in FIG. 12I, a dicing process is performed on the first reflective structure 2 and the second reflective structure 3 in the cutting tracks 62 and the sub-cutting track 54, and the second temporary carrier 8 is removed by laser lift off, heating separation, dissolution, irradiating with ultraviolet light or the like to separate the plurality of light-emitting devices.

In the step disclosed in FIG. 12A, the transparent covering structure 6 is filled in a space located between the adjacent conductive electrodes 4 of the light-emitting unit 1. Therefore, as shown in FIG. 12I, the transparent covering structure 6 is located between the upper portions 41 of the adjacent conductive electrodes 4 so that the transparent covering structure 6 is located between the light-emitting unit 1 and the second portion 32 of the second reflective structure 3 which is between the conductive electrodes 4. In another embodiment, the transparent covering structure 6 is not filled between the adjacent conductive electrodes 4 of the light-emitting unit 1. Hence, only the second portion 32 of the second reflective structure 3 is between the adjacent conductive electrodes 4 without the transparent covering structure 6 filled in. In another embodiment, the cutting track and/or the sub-cutting track 54 is created by a blade (not shown) with an inclined shape with the upper portion is wider and the lower portion is narrower to make the transparent encapsulation structure 6 have a portion close to the wavelength conversion structure 5 having an inclined shape like the inclined surface 271 shown in FIG. 11. In another embodiment, if the tip of the blade has an arc-shaped shape in a cross-sectional view, the inner surface of the first reflective structure 2 of the light-emitting device 700 shown in FIG. 10 and the light-emitting device 800 shown in FIG. 11 has one or multiple arc-shaped surfaces near the wavelength conversion structure 5.

Figure 13A:
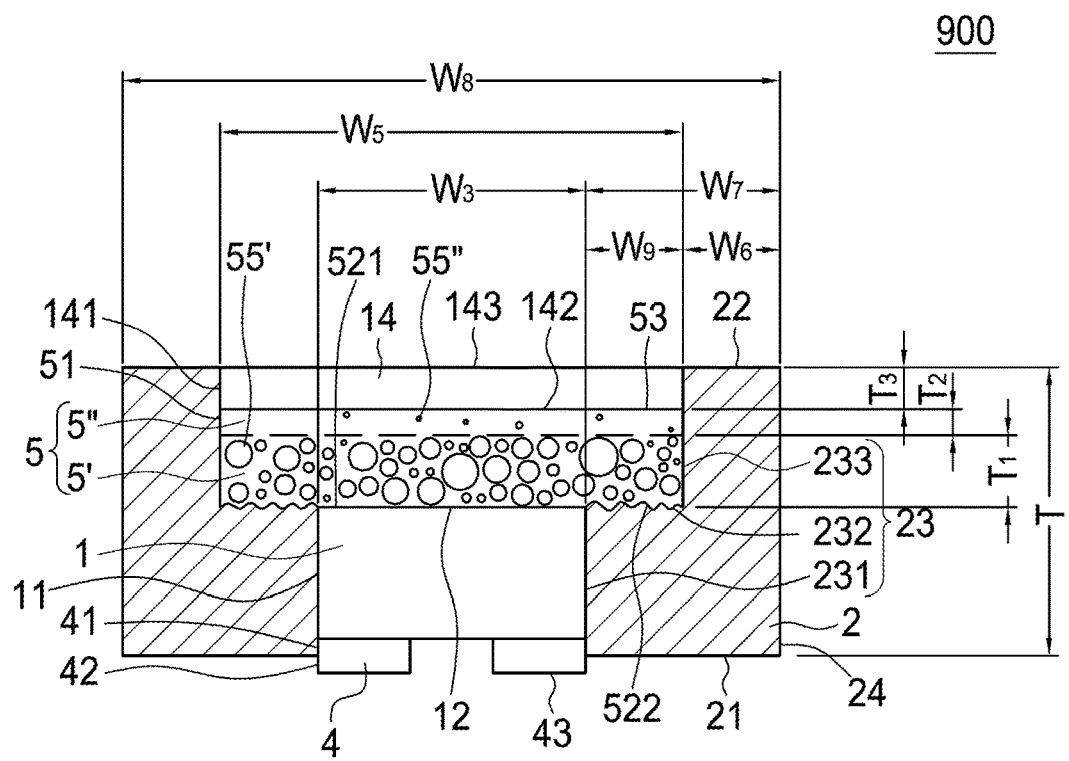
FIG. 13A shows a cross-sectional view of a light-emitting device in accordance with an embodiment of the present disclosure.

FIG. 13A shows a cross-sectional view of a light-emitting device in accordance with another embodiment disclosed in the present application. The light-emitting device 900 includes a light-emitting unit 1, a first reflective structure 2, a wavelength conversion structure 5, and a diffusion layer 14. The light-emitting unit 1 has a light-emitting surface 12, the two conductive electrodes 4 located on the bottom surface which is opposite to the light-emitting surface 12 of the light-emitting unit 1, and a plurality of side surfaces 11. The conductive electrode 4 includes an upper portion 41 closer to the light-emitting surface 12 and a lower portion 42 further from the light-emitting surface 12. The wavelength conversion structure 5 contains a matrix and the wavelength converting material (55' and 55"), and is located above and fully covers the light-emitting surface 12 of the light-emitting unit 1. The wavelength conversion structure 5 contacts the light-emitting surface 12. In other words, there is not additional material between the wavelength conversion structure 5 and the light-emitting unit 1. The side surface 51 of the wavelength conversion structure 5 is not coplanar with the side surface 11 of the light-emitting unit 1. The wavelength conversion structure 5 has a width W5, wherein 1000 μm≤W5≤1250 μm. In an embodiment, W5=1100 μm or 1150 μm. The light-emitting unit 1 has a width W3 smaller than W5. In other words, the bottom surface of the wavelength conversion structure 5 includes a first bottom surface 521 contacting the light-emitting surface 12 of the light-emitting unit 1 and a second bottom surface 522 without contacting the light-emitting unit 1 and exceeding the outmost edge of the light-emitting unit 1.

The wavelength conversion structure 5 includes the first wavelength conversion layer 5' and the second wavelength conversion layer 5". The second wavelength conversion layer 5" is disposed above the first wavelength conversion layer 5'. Hence, the first wavelength conversion layer 5' directly contacts the light-emitting surface 12 of the light-emitting unit 1 and the second wavelength conversion layer 5" does not contacts the light-emitting surface 12. The first wavelength conversion layer 5' includes the first wavelength converting material 55', and the second wavelength conversion layer 5" includes the second wavelength converting material 55". The wavelength converting materials 55',55" have the same or similar excitation/emission wavelength. The majority of the first wavelength converting material 55' has a particle diameter of more than 7 μm. In one embodiment, more than 95% of the first wavelength converting material 55' has a particle diameter of more than 10 nm. Each of more than 95% of the second wavelength conversion material 55" has a particle diameter less than 10 nm. In another embodiment, each of the second wavelength converting materials 55" has a particle diameter less than 5 nm. The largest particle diameter of the first wavelength converting material 55' is a, and the largest particle diameter of the second wavelength converting material 55" is b, a>b. The particle shape of the wavelength converting material can be circular, oval, or irregularly shape. The particle diameter in this case refers to the maximum outer diameter of a particle in a two-dimensional plane (for example, in a cross-sectional view) or in a three-dimensional space. In addition, the first wavelength converting material 55' has a first weight percentage with respect to the first wavelength conversion layer 5', and the second wavelength conversion material 55" has a second weight percentage with respect to the wavelength conversion layer 5". The first weight percentage is greater than the second weight percentage. For example, the first weight percentage is more than 5 times of the second weight percentage. In one embodiment, the first weight percent is greater than 90% and the second weight percent is less than 10%. In other words, the majority of material of the second wavelength conversion layer 5" is the matrix, and the rest small portion is the wavelength conversion materials with small particle diameter. That is to say, in a cross-sectional view, the area density of the first wavelength conversion material 55' in the first wavelength conversion layer 5' is greater than the area density of the second wavelength conversion material 55" in the second wavelength conversion layer 5", for example, the area density of the first wavelength conversion material 55' is more than five times of the area density of the second wavelength conversion material 55". The method of measuring the weight percentage can be the thermogravimetric analysis (TGA), and the method of measuring the particle diameter of wavelength conversion material can be electron microscopy. The method of measuring the area density of the wavelength conversion material in the wavelength conversion structure can be electron microscopy.

There is no clear separating line between the first wavelength conversion layer 5' and the second wavelength conversion layer 5". As FIG. 13A shows, a top surface where the first wavelength conversion layer 5' is close to the second wavelength conversion layer 5" is substantially a horizontal flat surface so the first wavelength conversion layer 5' has a substantially uniform first thickness T1 from the leftmost side to the rightmost side. In addition, similar to the first wavelength conversion layer 5', the second wavelength conversion layer 5" also has a substantially uniform second thickness T2 from the leftmost side to the rightmost side, wherein T1 is greater than T2. The wavelength conversion structure 5 has a thickness (sum of T1 and T2), wherein 50 μm<(T1+T2)<80 μm. In an embodiment, T1+T2≈70 μm; 25 μm<T1<60 μm, 5 μm<T2<35 μm. The first bottom surface 521 and the second bottom surface 522 of the wavelength conversion structure 5 have different surface roughness. The first bottom surface 521 contacting the light-emitting surface 12 of the light-emitting unit 1 has a first surface roughness R1, the second bottom surface 522 without contacting the light-emitting surface 12 of the light-emitting unit 1 has a second surface roughness R2, wherein R2>R1. In more details, the first bottom surface 521 is substantially a flat surface and the second bottom surface 522 has a plurality of tiny concave surfaces and convex surfaces (for example, the maximum height difference of the concave and convex surfaces is more than 100 nm or 150 nm). Besides, the top surface 53 of the wavelength conversion structure has a third surface roughness R3, and the side surface 51 of the wavelength conversion structure has a fourth surface roughness R4, in one embodiment, R2>R3>R4.

Figure 14:
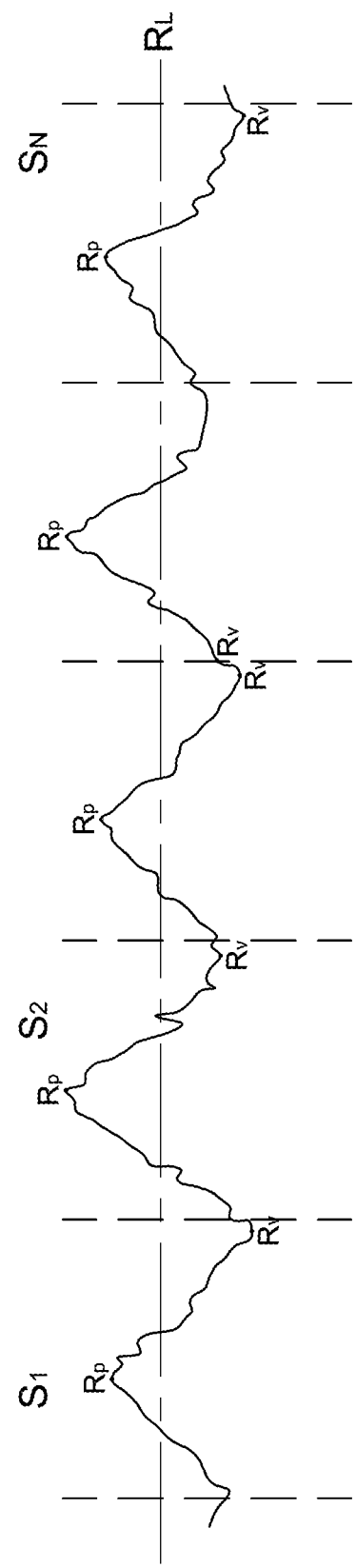
FIG. 14 shows an example of a rough curve of a rough surface.

Surface roughness can be measured by a rough curve gotten from a cross-sectional of the rough surface. FIG. 14 shows an example of a rough curve of a rough surface, and the rough curve can be divided into N sample lengths ($S_1$, $S_2$, $S_3$ ... $S_N$). Each sample length can define a reference line $R_L$ (reference line). The reference line $R_L$ (reference line) is a straight line and passes through the rough curve of the rough surface with peaks and troughs. The reference line has a plurality of intersections with the rough curve and divides the rough curve into two portions (the first rough curve and the second rough curve) which are located at the up side (left side) and down side (right side) of the reference line respectively. Basically, the area formed by the first rough curve and the reference line $R_L$ is equal to the area formed by the second rough curve and the reference line $R_L$. Each of sample lengths can be measured a highest peak (Rp) and the lowest trough (Rv) relative to the reference line $R_L$. Maximum height of the profile for each of sample lengths is defined as Ry=|Rp|+|Rv|. Thus, the surface roughness of the rough surface can be defined by the average of the maximum height of the profile Ry of all sample lengths. When Ry is larger, the surface is rougher. That is to say, the height difference of the concave and the convex surface on the rough surface is larger by observed by the naked eye.

The diffusion layer 14 is located above and directly contacts the wavelength conversion structure 5, and has substantially same width or similar shape as the wavelength conversion structure 5 (viewed in a top view). That is to say, the side surface 51 of the wavelength conversion structure 5 is substantially coplanar with the side surface 141 of the diffusion layer 14. Referring to FIG. 13A, the diffusion layer 14 has a thickness T3, wherein 10 μm≤T3≤35 μm. In an embodiment, T3=30 μm. The diffusion layer 14 includes a matrix and diffusion particles. The matrix can include epoxy, silicone, PI, BCB, PFCB, SU8, acrylic resin, PMMA, PET, PC, or polyetherimide. The diffusion particles can include silicon dioxide, titanium dioxide, zirconium oxide, zinc oxide, or aluminum oxide. In one embodiment, the diffusion layer 14 includes the silicon dioxide with high weight percentage concentration (w/w), for example, weight percentage concentration (w/w) is greater than 20%, greater than 25%, greater than 30%, or greater than 35%. The diffusion layer 14 with high weight percentage concentration makes the color distribution of the light-emitting device 900 more uniform over different viewing angles. The color distribution can be expressed by Δu'v', and the smaller Δu'v' means the color distribution is more uniform. While u' and v' indicate the color coordinates on the CIE1976 color space, the reference point ($u_0'$, $v_0'$) is defined as the average value of the color coordinates over all angles of the emitted light. In that case, $\Delta u'=u'-u_0', \Delta v'=v'-v_0', \Delta u'v'=(\Delta u'^2+\Delta v'^2)^{1/2}$. In one embodiment, the light-emitting device 900 has a Δu'v' smaller than 0.003 over viewing angles of 0° to −70°. In addition, the diffusion layer 14 has a bottom surface 142 contacting wavelength conversion structure 5 and a top surface 143 opposite to the bottom surface 142 for light emitting out. The surface roughness of the bottom surface 142 is equal to or close to the surface roughness R3 of the top surface 53 of wavelength conversion structure 5. The top surface 143 has a sixth surface roughness R6, wherein R6<R2, and R6 is substantially similar to R3. The surface roughness of the side surface 141 is substantially equal to or close to the surface roughness R4 of the side surface 51 of the wavelength conversion structure 5. That is to say, the side surface 141 of the diffusion layer 14 has a surface roughness same as or close to the surface roughness of the side surface 51 of the wavelength conversion structure 5. In an embodiment, the top surface 143 of the diffusion layer 14 has a surface roughness similar to that of the bottom surface 142 and is flatter than the second bottom surface 522 of the wavelength conversion structure 5.

Figure 13B:
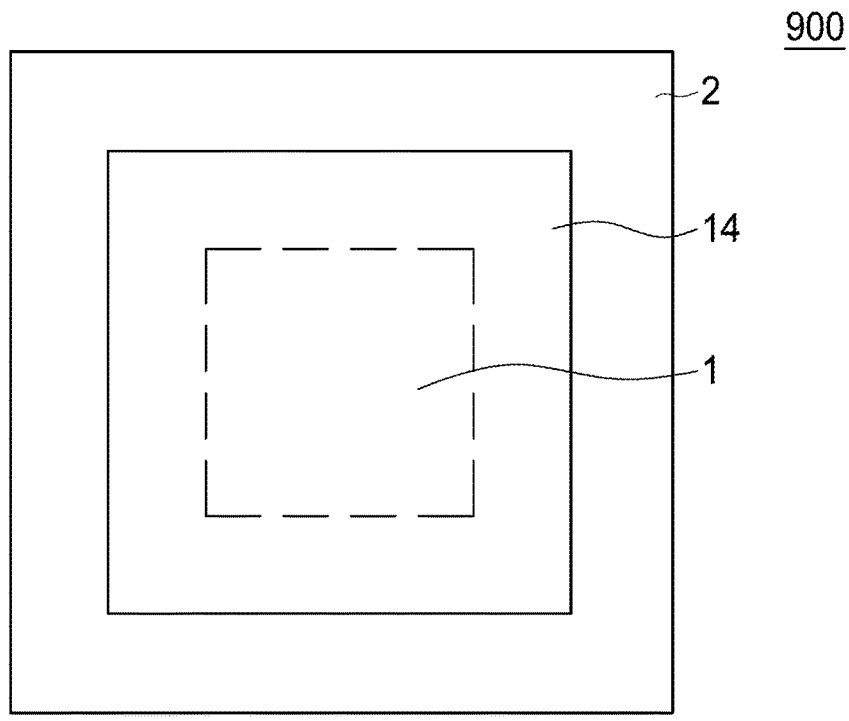
FIG. 13B shows a top view of a light-emitting device in accordance with an embodiment of the present disclosure.

The first reflecting structure 2 surrounds and contacts the side surface 11 of the light-emitting unit 1, the side surface 51 of the wavelength conversion structure 5, and the side surface 141 of the diffusion layer 14. The first reflective structure 2 has an uneven width. The inner surface 23 of the first reflective structure 2 includes three portions 231, 232, 233 not aligned to each other with a line. The first portion 231 and the third portion 233 are substantially parallel to the side surface 11 of the light-emitting unit 1. The second portion 232 connects and is substantially perpendicular to the first portion 231 and the third portion 233. The first portion 231 of the inner surface 23 is substantially perpendicular to the bottom surface 21, and surrounds and contacts the side surface 11 of the light-emitting unit 1. The second portion 232 contacts the second bottom surface 522 of the wavelength conversion structure 5. In more details, the second portion 232 fully overlaps the second bottom surface 522 and has the same surface roughness. The third portion 233 surrounds and contacts the side surface 51 of the wavelength conversion structure 5 and the side surface 141 of the diffusion layer 14. The first portion 231 has a distance W7 to the outer surface 24. The third portion 233 has a distance W6 to the outer surface 24, wherein W7 is different from and larger than W6. The top surface 22 of the first reflective structure 2 is substantially coplanar with the top surface 143 of the diffusion layer 14. That is to say, the first reflective structure 2 does not cover the top surface 143 of the diffusion layer 14 so that the light emitted from the light-emitting unit 1 passes through the wavelength conversion structure 5 and the diffusion layer 14 and emits upward from the top surface 143 of the diffusion layer 14. The light-emitting device 900 has a width W8 substantially equal to the maximum width of the first reflective structure 2, and W8 is about 1.2 to 3 times of W3. In an embodiment, W8/W3=1.3~2.6. In addition, W8>W5>W3. The material of the first reflective structure 2 can be referred to the aforementioned descriptions. The light-emitting device 900 has a maximum height T not larger than 300 μm. In an embodiment, T is not larger than 260 μm, or 250 μm. The overall height (T1+T2+T3) of the wavelength conversion structure 5 and the diffusion layer 14 is preferably not larger than 150 μm. The overall height of the wavelength conversion structure 5 and the diffusion layer 14 is a key parameter of the color temperature and the color distribution of the light-emitting device 900. For example, the overall height can be 120 μm, 100 μm, or 80 μm. FIG. 13B shows a top view of the light-emitting device 900 showing the periphery of the diffusion layer 14 being surrounded by the first reflective structure 2. Thus, similar to the light-emitting device 700 or light-emitting device 800, the wavelength conversion structure 5 of the light-emitting device 900 located below the diffusion layer 14 is surrounded by the first reflective structure 2, so that the light-emitting device 900 has a small emitting angle. In one embodiment, the emitting angle of the light-emitting device 900 is less than 120 degree, preferably not more than 115 degree. The first reflective structure 2 also surrounds the diffusion layer 14 covering the wavelength conversion structure 5 so that the light-emitting device 900 has a better light concentration and more uniform color distribution.

Figure 15A:
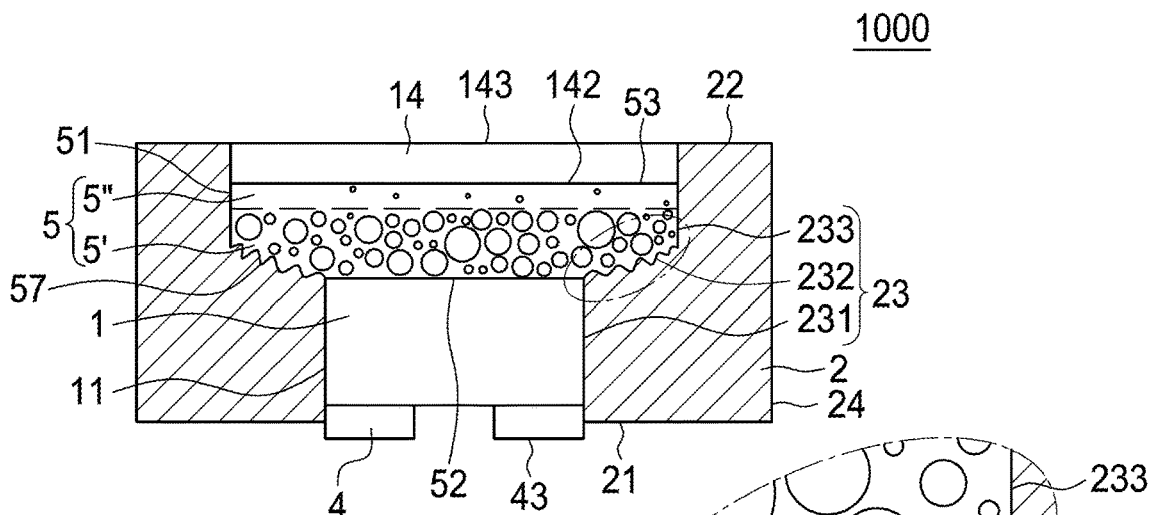
FIG. 15A shows a cross-sectional view of a light-emitting device in accordance with an embodiment of the present disclosure.

In another embodiment, the second portion 232 of the inner surface 23 of the first reflective structure 2 is an inclined surface, as shown in FIG. 15A. Referring to FIG.

15A, the light-emitting device 1000 is similar to the light-emitting device 900 and includes a light-emitting unit 1, a first reflective structure 2, a wavelength conversion structure 5, and a diffusion layer 14. The devices or elements with similar or the same symbols represent those with the same or similar functions to aforementioned embodiment can refer to aforementioned description. The wavelength conversion structure 5 includes the first wavelength conversion layer 5' and the second wavelength conversion layer 5". The wavelength converting material in the first wavelength conversion layer 5' has a weight percentage different from the wavelength converting material in the second wavelength conversion layer 5", wherein the second wavelength conversion layer 5" with lower weight percentage is located above the first wavelength conversion layer 5' with higher weight percentage. As shown in FIG. 15A, the inner surface 23 of the first reflective structure 2 includes three portions not aligned to each other in a line. The first portion 231 and the third portion 233 are substantially parallel to the side surface 11 of the light-emitting unit 1. The second portion 232 connects and is not perpendicular to the first portion 231 and the third portion 233. The distance between the second portion 232 and the outer surface 24 decreases along the direction from the first portion 231 to the third portion 233. The first portion 231 surrounds and contacts the side surface 11 of the light-emitting unit 1, and the second portion 232 surrounds and contacts the lower portion (closer to the light-emitting unit 1) of the first wavelength conversion layer 5'. The third portion 233 surrounds and contacts the diffusion layer 14, the second wavelength conversion layer 5", and the upper portion of the first wavelength conversion layer 5' (further away from the light-emitting unit 1).

Figure 15B:
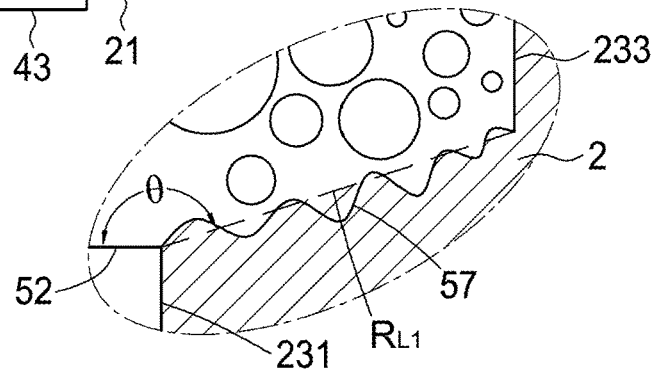
FIG. 15B shows a portion of the enlarge view of a light-emitting device in accordance with an embodiment of the present disclosure.
Figure 16A:
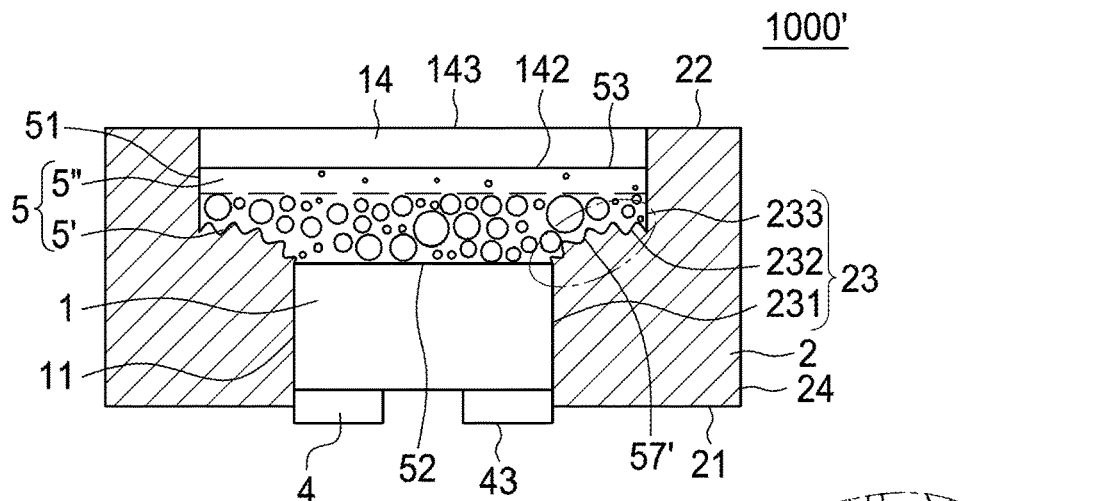
FIG. 16A shows a cross-sectional view of a light-emitting device in accordance with an embodiment of the present disclosure.
Figure 16B:
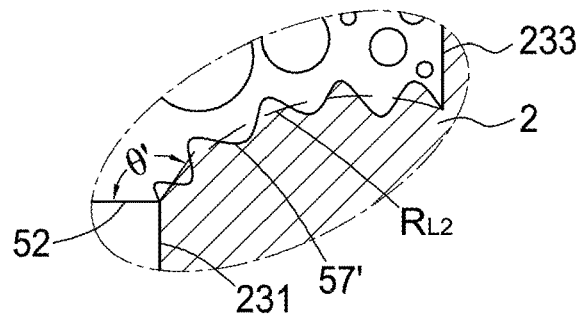
FIG. 16B shows a portion of the enlarged view of a light-emitting device in accordance with an embodiment of the present disclosure.

Referring to FIG. 15A, the wavelength conversion structure 5 of the light-emitting device 1000 has an inverted frustum in a cross-sectional view. The wavelength conversion structure 5 has a bottom surface 52 contacting the light-emitting unit 1, an top surface 53 opposite to the bottom surface 52 and contacting the diffusion layer 14, a side surface 51 connecting the top surface 53 (side surface 51 can be tilted inwardly or nearly perpendicularity according to the process conditions), and an inclined surface 57 connecting the side surface 51 and the bottom surface 52. FIG. 15B shows an enlarged view of the inclined surface 57 which is a rough surface and has a reference line $R_{L1}$, $R_{L1}$ is substantially a straight line. The inclined surface 57 has a plurality of tiny concave surfaces and convex surfaces, and has the second surface roughness R2, the characteristics of the surface roughness can be referred to the aforementioned descriptions. In more details, the reference line $R_{L1}$ of the inclined surface 57 of the wavelength conversion structure 5 has an angle θ relative to the bottom surface 52, wherein the angle θ is obtuse. In another embodiment, as shown in FIG. 16A, the inclined surface 57' has an arc shape and a plurality of tiny concave and convex surfaces. FIG. 16B shows an enlarged view of the inclined surface 57', the inclined surface 57' is a rough surface and has a reference line $R_{L2}$, and $R_{L2}$ is substantially an arc curve. The reference line $R_{L2}$ of the inclined surface 57' of the wavelength conversion structure 5 has an angle θ' relative to the bottom surface 52 of the wavelength conversion structure 5 while the angle θ' gradually increases along the direction the inclined surface 57' away from the light-emitting unit 1. In one embodiment, the inclined surfaces 57, 57' can also be a smooth surface.

Figure 17A:
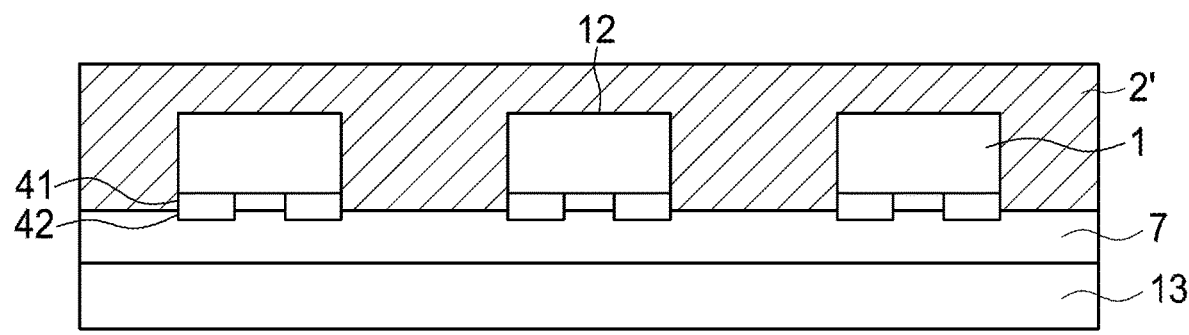
FIGS. 17A~17G show drawings of manufacturing a light-emitting device in accordance with an embodiment of the present disclosure.
Figure 17B:
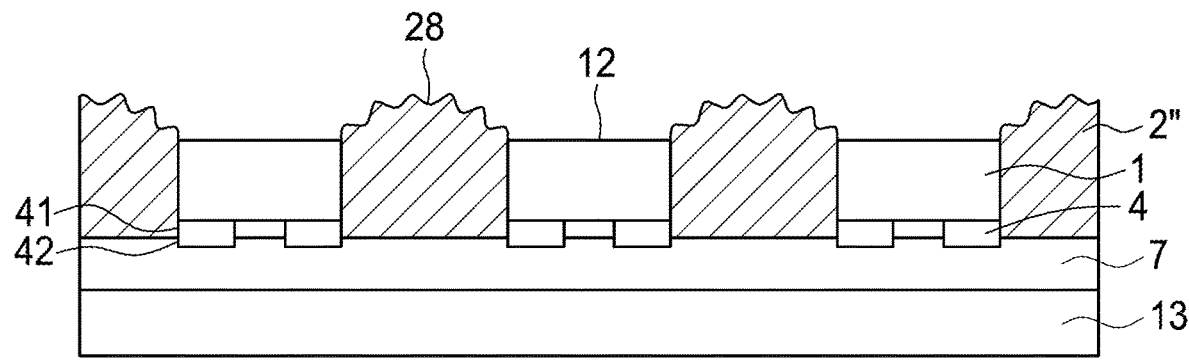

FIGS. 17A~17G show a manufacturing flow of a light-emitting device in accordance with an embodiment of the present disclosure. The devices or elements with similar or the same symbols represent those with the same or similar functions to aforesaid embodiment can refer to aforementioned description. Referring to FIG. 17A, a substrate 13 is provided and a first temporary carrier 7 which is adhesive is disposed thereon. Two conductive electrodes 4 of the plurality of light-emitting units 1 are adhered to the substrate 13 by the first temporary carrier 7. The lower portion 42 of the conductive electrode 4 is embedded in the first temporary carrier 7. The area between the adjacent light-emitting units 1 is defined as an aisle. Then the reflective structure 2' is formed to fill in the aisle and cover the light-emitting surface 12 of the light-emitting unit 1 and the upper surface of the first temporary carrier 7 which is not covered by the light-emitting unit 1. As FIG. 17B shows, a portion of the reflective structure 2' is removed to expose light-emitting surface 12 of the light-emitting unit 1 to form the reflection structure 2". The method of removing the reflective structure 2' can be wet deflash, such as water jet deflash or wet blasting deflash. The principle of the water jet deflash is using a nozzle to jet a liquid, such as water, with a jetting pressure for removing the reflective structure 2'. The wet blasting deflash includes the sand materials in the liquid, and the reflective structure 2' is removed by the jetting pressure of liquid and the collision caused by the sands materials on the surface of the reflective structure 2'. The removing speed is controlled by the sizes of the sand materials and the pressure of the liquid. The volume being removed is controlled by duration of the collision caused by the sands materials. In an embodiment, the thickness of the removed portion of the reflective structure above the light-emitting unit 1 is thicker than that in the aisle by controlling the duration and the strength of the collision. Hence, the top surface 28 of the reflective structure 2" located in the aisle is higher than the light-emitting surface 12 of the light-emitting unit 1, as shown in FIG. 17B. In one embodiment, the top surface 28 of the reflective structure 2" located in the aisle is substantially coplanar with the light-emitting surface 12 of the light-emitting unit 1, as the light-emitting device shown in FIG. 13A. In addition, the sand materials collide the top surface 28 of the reflective structure 2" to form a plurality of tiny concave and convex structures.

Figure 17C:
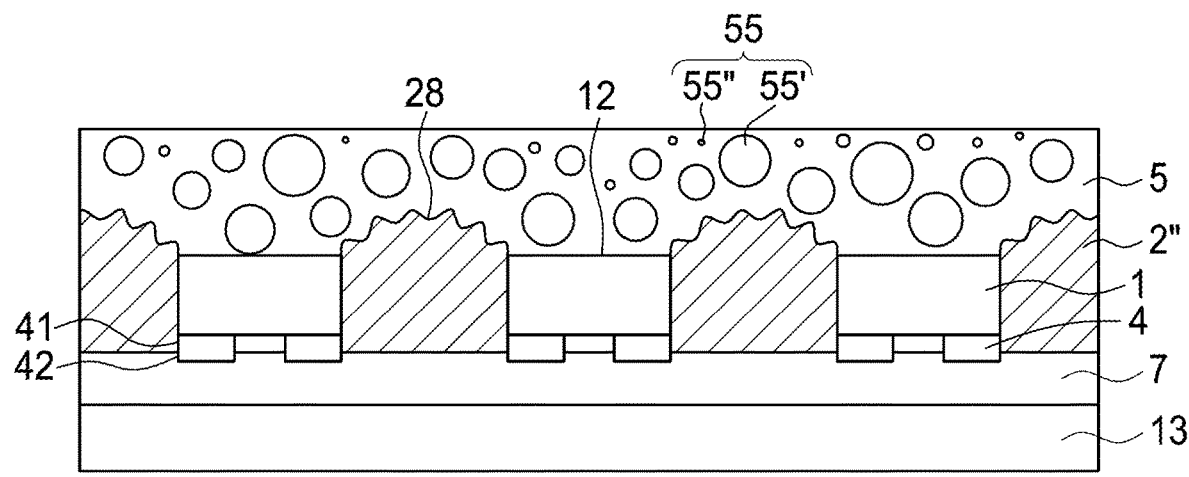
Figure 17D:
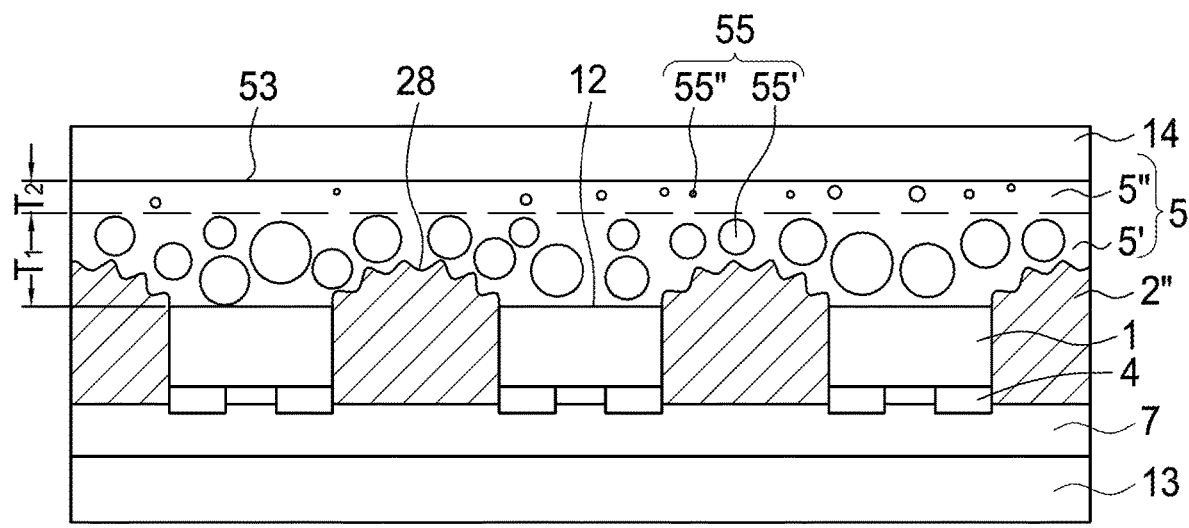
Figure 17E:
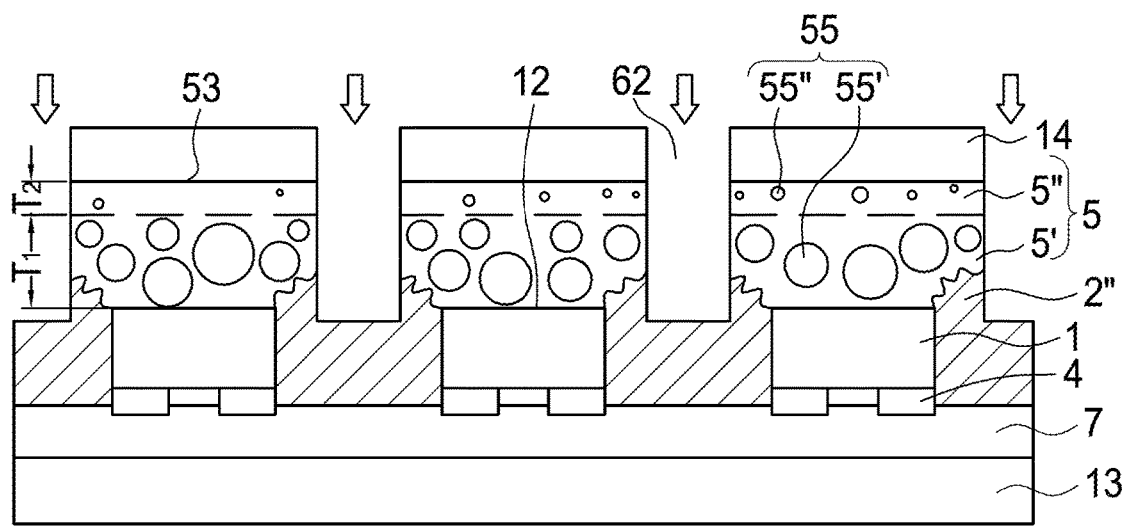
Figure 17F:
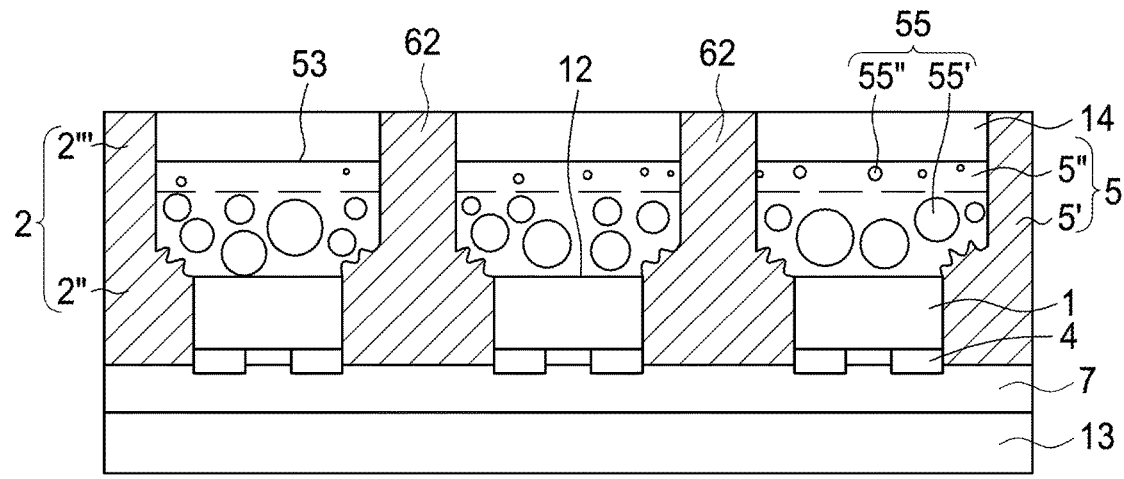
Figure 17G:
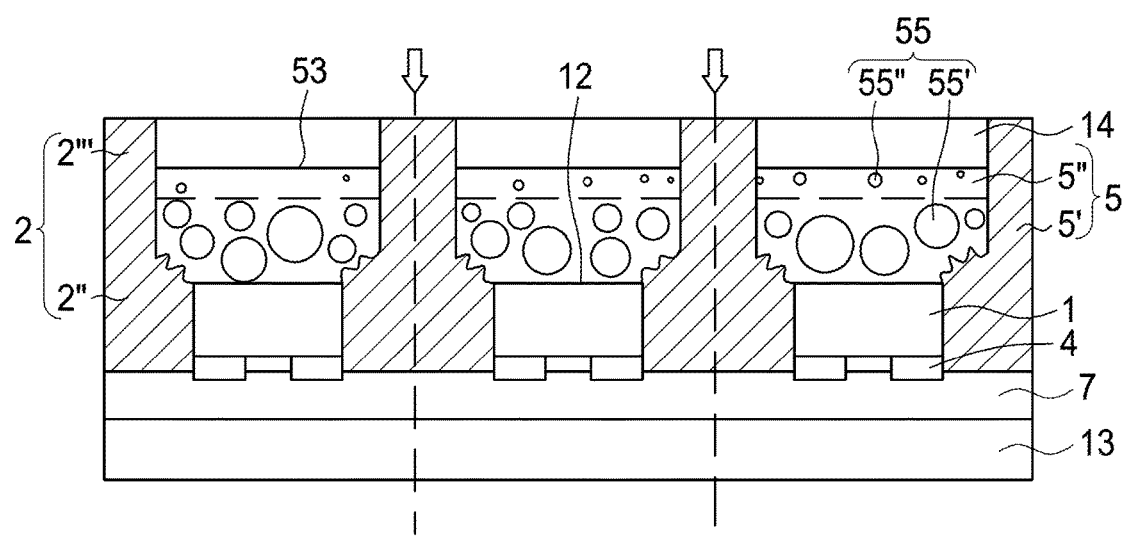

Next, as FIG. 17C shows, the wavelength conversion structure 5 is formed on the light-emitting surface 12 of the light-emitting unit 1 and the top surface 28 of the reflective structure 2". In the figure, wavelength converting materials (55' and 55") with different particle diameters are uniformly dispersed in the wavelength conversion structure 5. The particles with larger particle diameters are located under the particles with smaller particle diameters, or the particles with smaller particle diameters are located under the particles with large particle diameter. As FIG. 17D shows, the sedimentation method makes the wavelength converting material 55' having larger particle diameter stacked on the lower layer of the wavelength conversion structure 5 because of a larger settling rate and the wavelength converting material 55" having smaller particle diameter stacked on the upper layer of the wavelength conversion structure 5 because of a smaller settling rate, so that the wavelength conversion structure 5 forms the first wavelength conversion layer 5' and a second wavelength conversion layer 5". Then, a polish process is performed to planarize the top surface 53 of the wavelength conversion structure 5 and further adjust the overall thickness (T1+T2) of the wavelength conversion structure 5. Subsequently, as FIG. 17E shows, the diffusion layer 14, the wavelength conversion structure 5, and a small portion of the reflection structure 2" is removed by dicing to form the cutting track 62. In other words, the cutting track 62 separates each of the diffusion layer 14 and the wavelength conversion structure 5 collectively located above the different light-emitting units 1 from each other. The diffusion layer 14 and the wavelength conversion structure 5 above the light-emitting unit 1 collectively can have a width larger than that of the light-emitting unit 1 by choosing a blade with suitable width to dice. Thereafter, as shown in FIG. 17F, the reflective structure 2''' is formed in the cutting track 62 to make the top surface of the reflective structure 2''' substantially coplanar with the top surface of the diffusion layer 14 and form the first reflective structure 2. Here, a polish process can be performed to planarize the top surfaces of the first reflective structure 2 and the diffusion layer 14, and further adjust the overall thickness of the light-emitting device. Finally, as shown in FIG. 17G, the first reflective structure 2, the first temporary carrier 7, and/or the substrate 13 between the two adjacent light-emitting units 1 are diced, and the second temporary carrier 7 and the substrate 13 are removed by laser lift off, heating separation, dissolution, irradiating with ultraviolet light or the like to separate the plurality of light-emitting devices.

In another embodiment, the light-emitting device 900, 1000, or 1000' can also include a second reflective structure (not shown) located under the first reflective structure 2 and surrounding the conductive electrode 4. More information can refer to FIGS. 1, 10, 11 and the corresponding descriptions. Further, the light-emitting device 900, 1000, or 1000' can also include an optical element disposed above the diffusion layer 14, and the detailed description can be referred to the corresponding description of FIG. 5. The light-emitting device 900, 1000, or 1000' can also include the extending electrode under the conductive electrode, and the detailed description can be referred to the corresponding description of FIG. 6.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a light-emitting unit, comprising a light-emitting surface, a surface opposite to the light-emitting surface, a side surface, and a first conductive electrode and a second conductive electrode which are disposed under the surface, wherein the first conductive electrode has a plurality of first outer side surfaces and a first bottom surface, and the second conductive electrode has a plurality of second outer side surfaces and a second bottom surface;
a reflective structure comprising a first reflective structure and a second reflective structure disposed under the first reflective structure, the first reflective structurer covering the side surface of the light-emitting unit, and the second reflective structure surrounding the plurality of first outer side surfaces of the first conductive electrode and the plurality of second outer side surfaces of the second conductive electrode without blocking the first bottom surface of the first conductive electrode and the second bottom surface of the second conductive electrode, wherein the first reflective structure has a height 1.2-2.5 times greater than that of the light-emitting unit;
a transparent covering structure located between the light-emitting unit and the reflective structure; and
a wavelength conversion structure covering the transparent covering structure and the reflective structure, and the wavelength conversion structure being separated from the light-emitting unit by the transparent covering structure;
wherein the plurality of first outer side surfaces and the plurality of second outer side surfaces of the first conductive electrode and the second conductive electrode include an upper portion and a lower portion, the upper portion being closer than the lower portion to the light-emitting surface,
wherein the transparent covering structure directly contacts the upper portion of the first outer side surface and the second outer side surface of the first conductive electrode and the second conductive electrodes,
wherein the second reflective structure directly contacts the lower portion of the first outer side surface and the second outer side surface of the first conductive electrode and the second conductive electrode, and
wherein the transparent covering structure directly contacts the first reflective structure and the second reflective structure.

2. The light-emitting device according to claim 1, wherein the first reflective structure surrounds the transparent covering structure.

3. The light-emitting device according to claim 1, wherein the second reflective structure has a portion located between the first conductive electrode and the second conductive electrode.

4. The light-emitting device according to claim 1, further comprising an extending electrode connected to the first conductive electrode and extending beyond the side surface and toward an outmost edge of the light-emitting device.

5. The light-emitting device according to claim 1, further comprising a sub-transparent covering structure disposed between the transparent covering structure and the wavelength conversion structure, wherein the sub-transparent covering structure has an arched surface.

6. The light-emitting device according to claim 1, wherein each of the first conductive electrode and the second conductive electrode has an outmost edge not exceeding that of the light-emitting unit.

7. The light-emitting device according to claim 1, wherein the transparent covering structure has a flat bottom surface, the flat bottom surface has a width greater than zero, and the light-emitting unit has a width 2-11 times as large as the width of the flat bottom surface.

8. The light-emitting device according to claim 1, wherein the first reflective structure comprises an inner surface and an outer surface, the inner surface comprises a first portion and a third portion surrounding the wavelength conversion structure, and the outer surface has a distance to the third portion smaller than that to the first portion.

9. The light-emitting device according to claim 8, wherein the inner surface comprises a second portion connecting the first portion and the third portion with an inclined surface.

10. The light-emitting device according to claim 1, wherein the wavelength conversion structure directly contacts the first reflective structure and the transparent covering structure.

11. The light-emitting device according to claim 2, wherein the first reflective structure has an inner surface and a bottom surface, the inner surface has an angle with the bottom surface, the angle is an acute angle.

12. The light-emitting device according to claim 1, further comprising an optical element disposed on the wavelength conversion structure.

13. The light-emitting device according to claim 4, wherein the extending electrode has a width larger than that of the first conductive electrode.

14. The light-emitting device according to claim 1, wherein the first reflective structure has an inner surface and a bottom surface perpendicular to the inner surface.

15. The light-emitting device according to claim 1, wherein a top surface of the first reflective structure has a width smaller than that of a bottom surface of the first reflective structure.

16. The light-emitting device according to claim 1, wherein the surface of the light-emitting unit has an outmost edge separated from the first reflective structure by a non-zero distance.

17. The light-emitting device according to claim 1, wherein the first reflective structure is completely separated from the side surface by the transparent covering structure.

18. The light-emitting device according to claim 1, wherein the transparent covering structure covers at least a portion of the first conductive electrode and the second conductive electrode.

19. The light-emitting device according to claim 1, further comprising a diffusion layer disposed on the wavelength conversion structure.

* * * * *